(12) United States Patent
Lee et al.

(10) Patent No.: US 7,586,197 B2
(45) Date of Patent: Sep. 8, 2009

(54) WIRE STRUCTURE, METHOD OF FORMING WIRE, THIN FILM TRANSISTOR SUBSTRATE, AND METHOD OF MANUFACTURING THIN FILM TRANSISTOR SUBSTRATE

(75) Inventors: Je-hun Lee, Seoul (KR); Chang-oh Jeong, Suwon-si (KR); Beom-seok Cho, Seoul (KR); Yang-ho Bae, Suwon-si (KR)

(73) Assignee: Samsung Electronics, Co., Ltd, Suwon-si (KR)

( * ) Notice: Subject to any disclaimer, the term of this patent is extended or adjusted under 35 U.S.C. 154(b) by 175 days.

(21) Appl. No.: 11/474,918

(22) Filed: Jun. 24, 2006

(65) Prior Publication Data

US 2007/0013077 A1    Jan. 18, 2007

(30) Foreign Application Priority Data

Jul. 15, 2005    (KR) ...................... 10-2005-0064486

(51) Int. Cl.
*H01L 23/48*    (2006.01)
(52) U.S. Cl. ............................. 257/762; 257/E29.117
(58) Field of Classification Search ................ 257/762, 257/E29.117, E29.147, E29.151, E29.202, 257/E29.273, E29.276, 741
See application file for complete search history.

(56) References Cited

U.S. PATENT DOCUMENTS

| 6,441,489 | B1 * | 8/2002 | Motoyama | 257/751 |
| 6,518,630 | B2 * | 2/2003 | You et al. | 257/380 |
| 7,289,183 | B2 * | 10/2007 | Gan et al. | 349/147 |
| 2007/0013077 | A1 * | 1/2007 | Lee et al. | 257/762 |

FOREIGN PATENT DOCUMENTS

| JP | 09258246 | 10/1997 |
| JP | 2000 208773 | 7/2000 |
| KR | 2005 0003515 | 1/2005 |

OTHER PUBLICATIONS

English Abstract of Publication No. 09-258246.
English Abstract of Publication No. 2000-208773.
English Abstract of Publication No. 1020050003515.

* cited by examiner

*Primary Examiner*—Wai-Sing Louie
*Assistant Examiner*—Bilkis Jahan
(74) *Attorney, Agent, or Firm*—F. Chau & Associates, LLC

(57) ABSTRACT

Provided are a wire structure, a method of forming a wire, a thin film transistor (TFT) substrate, and a method of manufacturing the TFT substrate. The wire structure includes a barrier layer disposed on a lower structure, a copper conductive layer comprising copper or copper alloy disposed on the barrier layer, an intermediate layer comprising copper nitride disposed on the copper conductive layer, and a capping layer disposed on the intermediate layer.

5 Claims, 27 Drawing Sheets

WIRE STRUCTURE, METHOD OF FORMING WIRE, THIN FILM TRANSISTOR SUBSTRATE, AND METHOD OF MANUFACTURING THIN FILM TRANSISTOR SUBSTRATE

CROSS-REFERENCE TO RELATED PATENT APPLICATION

This application claims priority from Korean Patent Application No. 10-2005-0064486 filed on Jul. 15, 2005 in the Korean Intellectual Property Office, the disclosure of which is incorporated herein by reference in its entirety.

BACKGROUND OF THE INVENTION

1. Field of the Invention

The present invention relates to a wire structure, and more particularly, to a wire structure including copper or its alloy, a method of forming a wire, a thin film transistor (TFT) substrate, and a method of manufacturing a TFT substrate.

2. Description of the Related Art

A TFT substrate is used as a substrate for a liquid crystal display (LCD) having pixels in a matrix array and an organic electro luminescence (EL) display.

An LCD, which is one of the most widely used flat panel displays, includes two substrates having a plurality of electrodes and a liquid crystal layer interposed therebetween and adjusts the amount of light transmitted therethrough by applying a voltage to the electrodes to rearrange the orientations of liquid crystal molecules in the liquid crystal layer. In the LCD, TFTs are used as switching elements for controlling picture signals applied to the respective electrodes.

An organic electroluminescence (EL) display device displays a picture by electrically exciting phosphorescent organic material, and includes a driving TFT for supplying pixels with current necessary for light emission and a switching TFT.

As the display areas of LCD or the organic EL display devices increase, the gate lines and the data lines connected to the TFTs also grow longer, causing an increase in the resistance of wires. To counter signal delays resulting from the increase in resistance, gate lines and data lines can be formed of a material having as low a resistivity as possible.

Among various wiring materials, copper (Cu) is inexpensive and has relatively low resistivity. Cu has a resistivity of approximately 1.67 μΩcm, which is much lower than that of aluminum (Al), i.e., approximately 2.65 μΩcm. Therefore, in an actual process, a gate line or a data line made of Cu significantly improves the signal delay problem compared to an Al-based gate or data line.

However, since copper has poor adhesion with a lower structure such as an insulating substrate (e.g., glass substrate) or a semiconductor layer and poor resistance to chemicals, it is easily oxidized or corroded when exposed to chemicals in a subsequent process, which makes it difficult to use wire made of only copper. Thus, copper film can be used in the form of a multi-layered structure composed of copper film, an underlying barrier film, and an overlying capping film. However, when the copper film, the barrier film, and the capping film constituting the multi-layered structure are etched away in the same process using an etchant, some copper ions dissolved in the etchant may penetrate into a structure (e.g., semiconductor layer) under the multi-layered structure, thereby lowering the characteristics of the semiconductor layer, resulting in a reduction in reliability of a TFT. In addition, copper at an interface between the copper film and the capping film is selectively corroded during wet-etching for patterning or during removal of a photoresist film, thereby leading to a poor lateral profile of a wire such as with overhangs. These overhangs cause cracks in a subsequent process, thereby lowering the reliability of the wire.

SUMMARY OF THE INVENTION

According to an embodiment of the present invention, there is provided a wire structure including a barrier layer disposed on a lower structure, a copper conductive layer comprising copper or copper alloy disposed on the barrier layer, an intermediate layer comprising copper nitride disposed on the copper conductive layer, and a capping layer disposed on the intermediate layer.

According to an embodiment of the present invention, there is provided a method of forming a wire, the method including forming a barrier layer on a lower structure, forming a copper conductive layer comprising copper or copper alloy on the barrier layer, forming a intermediate layer comprising copper nitride on the copper conductive layer, forming a capping layer on the intermediate layer, etching the capping layer, the intermediate layer, and the copper conductive layer to expose the barrier layer, and etching the barrier layer.

According to an embodiment of the present invention, there is provided a thin film transistor (TFT) substrate including a gate wire disposed on an insulating substrate and comprising a gate line extending in a first direction and a gate electrode connected to the gate line, a data wire insulated from the gate wire on the insulating substrate and comprising a data line extending in a second direction to intersect the gate line, a source electrode connected to the data line, and a drain electrode separated from the source electrode, and a pixel electrode disposed at pixels on the gate wire and the data wire and connected to the drain electrode, the gate wire or the data wire having a barrier layer disposed on a lower structure, a copper conductive layer comprising copper or copper alloy disposed on the barrier layer, an intermediate layer comprising copper nitride disposed on the copper conductive layer, and a capping layer disposed on the intermediate layer.

According to an embodiment of the present invention, there is provided a method of manufacturing a TFT substrate, the method including forming a gate wire on an insulating substrate, the gate wire comprising a gate line extending in a first direction and a gate electrode connected to the gate line, forming a data wire on the insulating substrate, the data wire insulated from the gate wire and comprising a data line extending in a second direction to intersect the gate line, a source electrode connected to the data line, and a drain electrode separated from the source electrode, and forming a pixel electrode connected to the drain electrode at pixels on the gate wire and the drain wire, wherein forming the gate wire or the data wire includes forming a barrier layer on a lower structure, forming a copper conductive layer comprising copper or copper alloy on the barrier layer, forming an intermediate layer comprising copper nitride on the copper conductive layer, forming a capping layer comprising molybdenum or molybdenum alloy on the intermediate layer, etching the capping layer, the intermediate layer, and the copper conductive layer to expose the barrier layer, and etching the barrier layer.

BRIEF DESCRIPTION OF THE DRAWINGS

Exemplary embodiments of the present invention can be understood in more detail from the following descriptions taken in conjunction with the attached drawings in which.

DETAILED DESCRIPTION OF EXEMPLARY EMBODIMENTS

Exemplary embodiments of the present invention will now be described more fully hereinafter with reference to the accompanying drawings. This invention may, however, be embodied in different forms and should not be construed as limited to the embodiments set forth herein.

Figure 1:
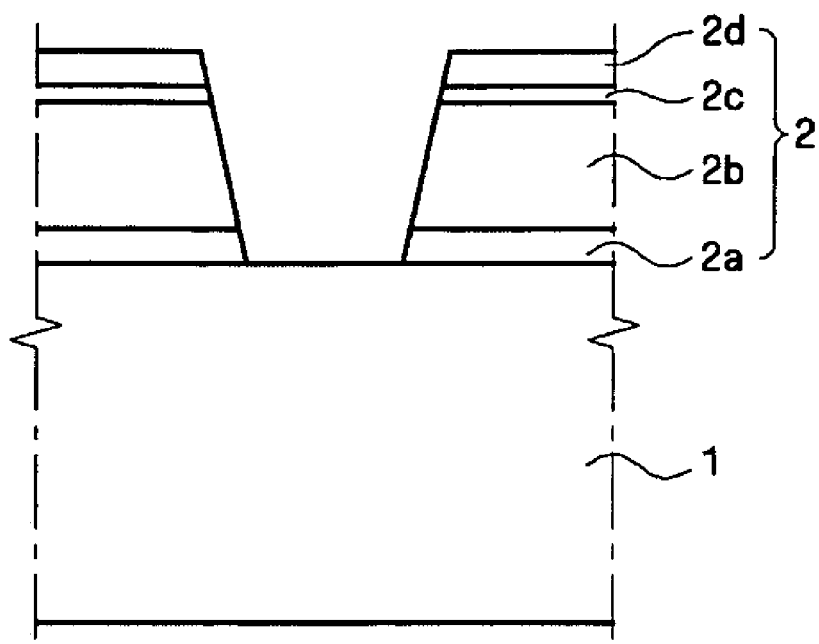
FIG. 1 is a sectional view of a wire structure according to an embodiment of the present invention.
Figure 2:
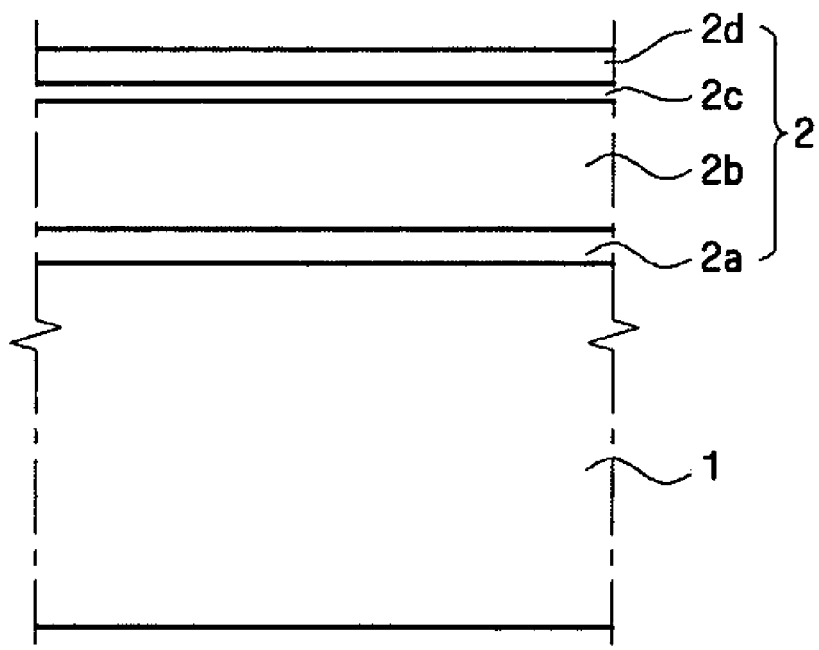
FIGS. 2 through 5 are sequential sectional views illustrating a method of forming a wire according to an embodiment of the present invention.

A wire structure and a method of forming a wire according to embodiments of the present invention will now be described more fully with reference to the accompanying drawings. FIG. 1 is a sectional view of a wire structure according to an embodiment of the present invention. FIGS. 2 through 5 are sequential sectional views illustrating a method of forming a wire according to an embodiment of the present invention.

Referring to FIG. 1, a wire structure according to an embodiment of the present invention comprises a lower structure 1 and a wire 2 including a barrier layer 2a, a copper conductive layer 2b, an intermediate layer 2c, and a capping layer 2c. The copper conductive layer 2b is disposed on the lower structure 1 with the barrier layer 2a interposed therebetween. The capping layer 2d is disposed on the copper conductive layer 2b, and the intermediate layer 2c is interposed between the copper conductive layer 2b and the capping layer 2d.

The lower structure 1 provides a surface for forming the wire 2 and supports the wire 2. The lower structure 1 may comprise a single structure having, for example, a single component, element, or layer, as well as a complex structure having a combination of multiple components, elements, and/or layers. The lower structure 1 may be, for example, an insulator substrate made of glass, a semiconductor layer made of amorphous silicon, an insulation layer, but not limited thereto.

The copper conductive layer 2b containing copper or its alloy is disposed on the lower structure 1. Here, copper is used as a low resistance wiring material because of its low cost and low resistivity in a thin film state, i.e., 2.1 μΩcm.

The barrier layer 2a interposed between the lower structure 1 increases an adhesion between the copper conductive layer 2b and the lower structure 1, and deters the diffusion of copper ions into the lower structure 1. Copper is prone to lifting or peeling while the copper conductive layer 2b is deposited and patterned due to its poor adhesion to the lower structure 1. To avoid this, the barrier layer 2a including other materials in addition to copper is provided between the lower structure 1 and the copper conductive layer 2b. The barrier layer 2a deters copper ions from diffusing into the lower structure 1, i.e., a semiconductor layer, thereby allowing the lower structure 1 to maintain its characteristic. Additionally, the barrier layer 2a deters materials present in the lower structure 1 from diffusing into the copper conductive layer 2b, thereby deterring resistivity of the copper conductive layer 2b from increasing.

The copper conductive layer 2b is formed by patterning using wet-etching. When the barrier layer 2a is etched by an etchant, copper ions dissolved in the etchant may permeate into an exposed portion of the lower structure 1 under the barrier layer 2a, thereby changing the characteristics of the lower structure 1. For example, when the lower structure 1 is a semiconductor layer, the semiconductor layer may be degraded, thereby lowering the reliability of the wire 2. Thus, it is preferable that the barrier layer 2a is made of a material which is not etched by the etchant for etching the copper conductive layer 2b, i.e., a material with a large etching selectivity for copper. Examples of useful materials for the barrier layer 2a include, but are not limited to Cr, Ti, Ta, V, Zr, W, Nb, Co, Ni, Pd, Pt, and a compound thereof. When the lower structure 1 is a structure free from risk of copper ions diffusing thereinto when etching is performed, e.g., an insulator substrate, a material that is etched away at the same time as the copper conductive layer 2b may be used as the barrier layer 2a, such as a capping layer 2d.

The capping layer 2d is disposed on the copper conductive layer 2b to deter corrosion of the copper conductive layer 2b through a reaction between the copper conductive layer 2b and chemical substance. For example, an etchant used in patterning the copper conductive layer 2b oxidizes and corrodes copper, thereby increasing resistivity. Thus, the capping layer 2d present on the copper conductive layer 2b deters the copper conductive layer 2b from being directly exposed to the etchant. Here, a material that is not corroded by an etchant for patterning the copper conductive layer 2b or that has high chemical resistance is used as the capping layer 2d. For processing simplicity, a material that is etched away at the same time as the copper conductive layer 2b, is used, and useful examples thereof include Mo-based materials including Mo, MoN, MoW, MoTi, MoNb, and MoZr, conductive oxides including IZO, ITO, and amorphous ITO.

Meanwhile, if the capping layer 2d is disposed directly on the copper conductive layer 2b, galvanic corrosion may occur at an interface between the capping layer 2d and the copper conductive layer 2b due to electron exchange between copper and a material (e.g., molybdenum (Mo)) constituting the capping layer 2d during etching the capping layer 2d and the copper conductive layer 2b or during removal of a photoresist film. As a result, the corrosion rate of copper with active potential increases, and the copper conductive layer 2b is selectively corroded at the interface between it and the capping layer 2d, thereby creating overhangs. These overhangs may cause cracks in a subsequent process, thereby lowering the reliability of the wire 2.

To deter such galvanic corrosion, as shown in FIG. 1, the intermediate layer 2c is interposed between the capping layer 2d and the copper conductive layer 2b so an electron exchange between the copper conductive layer 2b and the capping layer 2d is deterred. The intermediate layer 2c can have an insulating property or a semiconducting property which is an intermediate property between conducting property and insulating property. Even when the intermediate layer 2c has a semiconducting property, electron exchange can be considerably reduced, thereby reducing an overhang phenomenon by galvanic corrosion. In addition to materials having an insulating property or a semiconducting property, the same material as the copper conductive layer 2b underlying the intermediate layer 2c may also be used to form the intermediate layer 2c from the viewpoint of processing simplicity. For example, the intermediate layer 2c may include copper nitride (CuNx) exemplified by Cu3N. In this case, the intermediate layer 2c needs not be copper nitride only. Rather, the intermediate layer 2c may include not only copper nitride but also copper or other materials. Here, the copper nitride contained in the intermediate layer 2c may be in an amount sufficient to deter galvanic corrosion. The amount of the copper nitride in the intermediate layer 2c may be in a range of about 0.001 to about 50 atomic percent when expressed by the atomic percent of nitrogen based on all atoms in the intermediate layer 2c.

The thickness of the intermediate layer 2c can be determined in consideration of the degree of its insulating property. For example, when the atomic percent of nitrogen is high, that is, when the intermediate layer 2c exhibits a relatively high degree of insulating property, even a small thickness of the intermediate layer 2c may be acceptable. However, when the atomic percent of nitrogen is low, that is, when the intermediate layer 2c exhibits a relatively low degree of insulating property, the thickness of the intermediate layer 2c should be sufficiently large. For example, the thickness of the intermediate layer 2c can be adjusted in a range of about 50 to about 1000 angstroms.

Hereinafter, a method of forming a wire with the above-described wire structure will be described with reference to FIGS. 1 through 5.

First, the lower structure 1 including an insulating substrate (e.g., glass), a semiconductor layer, or an insulating layer is prepared. Then, a material including Cr, Ti, Ta, V, Zr, W, Nb, Co, Ni, Pd, Pt, or a compound thereof is deposited on the lower structure 1 using, for example, sputtering, to form a barrier layer 2a. The thickness of the barrier layer 2a may be about 50 to about 500 angstroms, and preferably about 100 to about 300 angstroms.

Then, copper or its alloy is deposited on the barrier layer 2a using, for example, sputtering, to form a copper conductive layer 2b. Here, the sputtering is performed such that argon gas, which is an inactive gas, is induced into a chamber and to allow argon (Ar) positive ions, which are in a plasma state, to collide with Cu or a copper alloy as a target. A thickness of the copper conductive layer 2b is preferably in a range of about 1500 to about 2500 angstroms.

Next, reactive sputtering is performed in situ by supplying nitrogen ($N_2$) with an induced amount of Ar gas reduced in the same chamber. Unlike the Ar gas, which is an inactive gas, nitrogen gas reacts with atoms in a target when colliding with the target in a plasma state. Thus, when Cu or a copper alloy is used as a target, the nitrogen gas reacts with Cu atoms to form copper nitride. Copper nitride is then deposited on the copper conductive layer 2b to form an intermediate layer 2c. At this time, all target elements do not react with nitrogen gas. Thus, copper atoms which have collided with argon gas and copper atoms which have collided with nitrogen gas but have not reacted with it, together with copper nitride, constitute the intermediate layer 2c. Argon gas and nitrogen gas contained in the sputtering chamber may be in ratios of about 90:10 to about 40:60. A thickness of the intermediate layer 2c can be adjusted in a range of about 50 to about 1000 angstroms.

Then, a capping layer 2d is formed on the intermediate layer 2c by sputtering using argon gas. Here, a material that is etched away using the same etchant together with a copper-based material forming the underlying intermediate layer 2c and the copper conductive layer 2b, that is, a material that has a small selectivity, is used. Specific examples of the useful capping layer 2d include Mo, MoN, MoW, MoTi, MoNb, MoZr, a conductive oxide such as IZO, ITO or amorphous ITO. In such a way, formation of a four-layered wire structure having the barrier layer 2a, the copper conductive layer 2b, the intermediate layer 2c and the capping layer 2d is completed.

Figure 3:
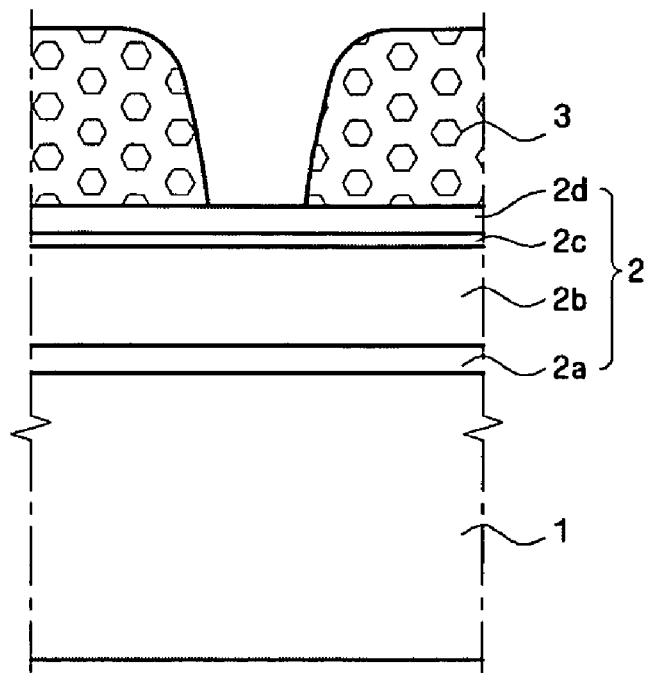

Referring to FIG. 3, photoresist is coated on the multi-layered wire 2, followed by exposure and development, to form a photoresist pattern 3 placing a wire.

Figure 4:
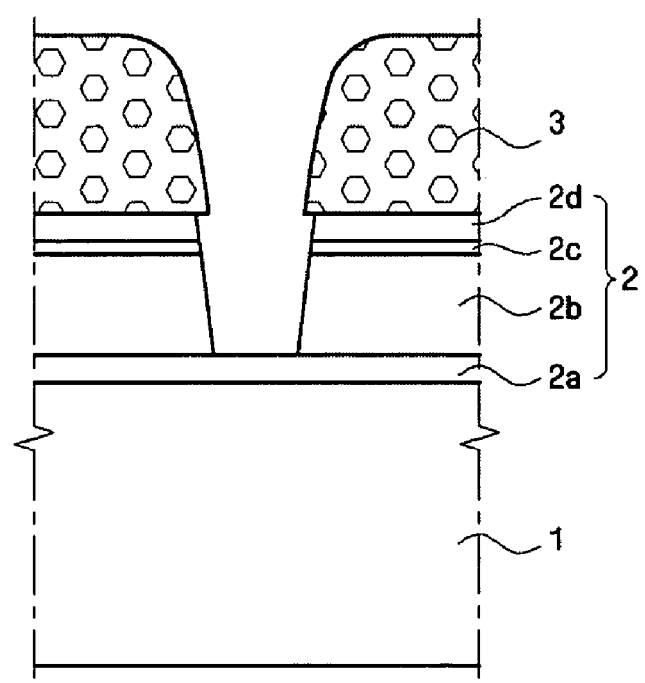

Then, referring to FIG. 4, the capping layer 2d, the intermediate layer 2c, and the copper conductive layer 2b are sequentially etched using the photoresist pattern 3 as an etching mask to expose the barrier layer 2a. Here, etching may be wet etching, and the capping layer 2d, the intermediate layer 2c, and the copper conductive layer 2b may be etched in the same process using the same etchant. Hydroperoxide or nitric acid based etchant may be used as the etchant and phosphoric acid or acetic acid may further be included in the etchant. Since the barrier layer 2a is not etched away by the etchant and covers the lower structure 1, it is possible to protect the lower structure 1 from being attacked by the etchant having copper ions or other elements dissolved therein.

Figure 5:
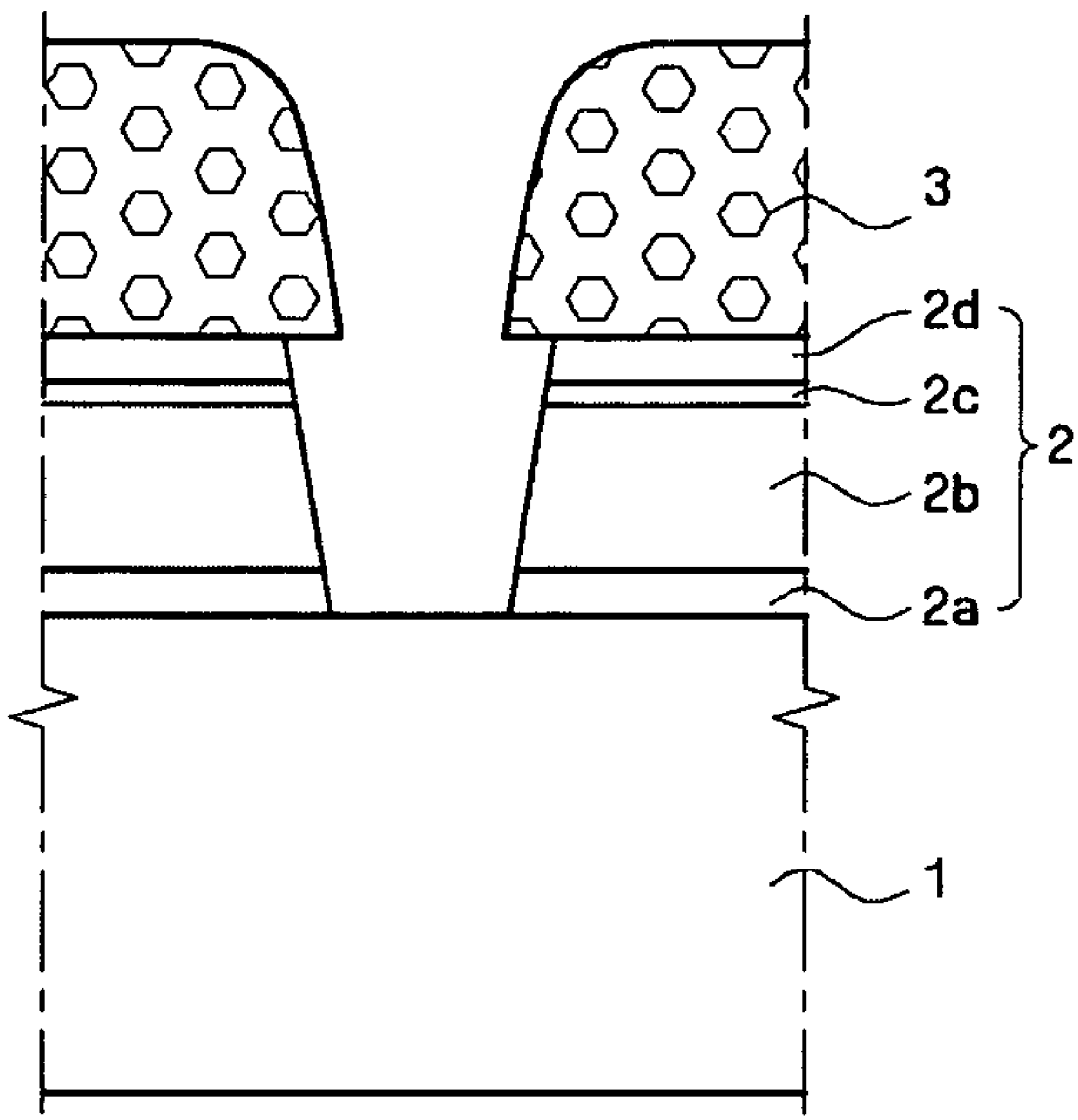

Referring to FIG. 5, the barrier layer 2a is etched using the photoresist pattern 3 as an etching mask to expose the lower structure 1. Here, etching may be dry etching, and examples of the useful etchant include etching gases selected from the group consisting of HCl, Cl2, H2, O2, or a combination thereof.

Referring back to FIG. 1, the photoresist pattern 3 is then removed. This completes the wire structure shown in FIG. 1. While the illustrated example has shown that the barrier layer 2a is dry-etched using the photoresist pattern 3 as an etching mask, an upper layer pattern of the barrier layer 2a may be wet-etched to then remove the photoresist pattern 3, followed by performing dry etching using the upper layer pattern as an etching mask, to thus form the wire structure.

If the barrier layer 2a is made of a material capable of being etched together with the copper conductive layer 2b and the capping layer 2d, etching can be performed without having to performing the above-described two separate etching processes.

The thus-formed wire 2 exhibits a good lateral profile without lateral corrosion since the intermediate layer 2c interposed between the copper conductive layer 2b and the capping layer 2d deters an electron transfer during wet-etching and photoresist film removal, thereby deterring galvanic corrosion. Furthermore, the lateral profile has a good taper angle without overhangs.

The above-described wire structure and the fabrication method thereof according to the present invention can be applied to a TFT substrate for an LCD or an organic EL display, a semiconductor device, a semiconductor apparatus, and any other areas necessitating precise wiring patterns. Although exemplary embodiments are described with regard to a TFT substrate the invention is not limited thereto.

The term "thin film transistor" used herein refers to a substrate encompassing at least one TFT but does not preclude the intervention of another structure between the TFT and the substrate or the presence of additional structure formed thereon.

Figure 6A:
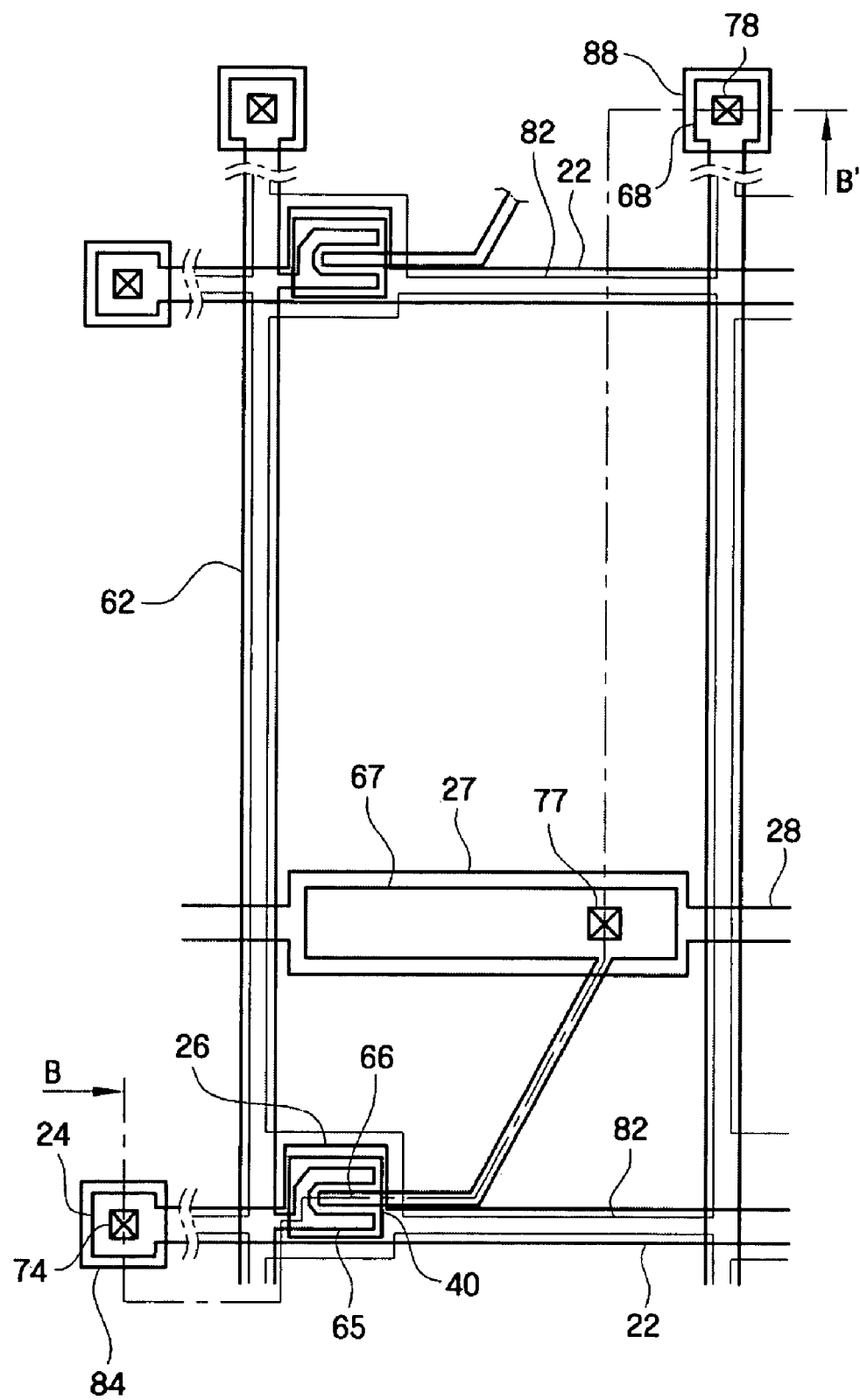
FIG. 6A illustrates a layout of a TFT substrate according to an embodiment of the present invention.

First, a thin film transistor (TFT) substrate according to an embodiment of the present invention including the wire structure stated above will be described with reference to FIGS. 6A and 6B. FIG. 6A illustrates a layout of a TFT substrate according to one embodiment of the present invention, and FIG. 6B is a sectional view taken along a line B-B' of FIG. 6A.

Figure 6B:
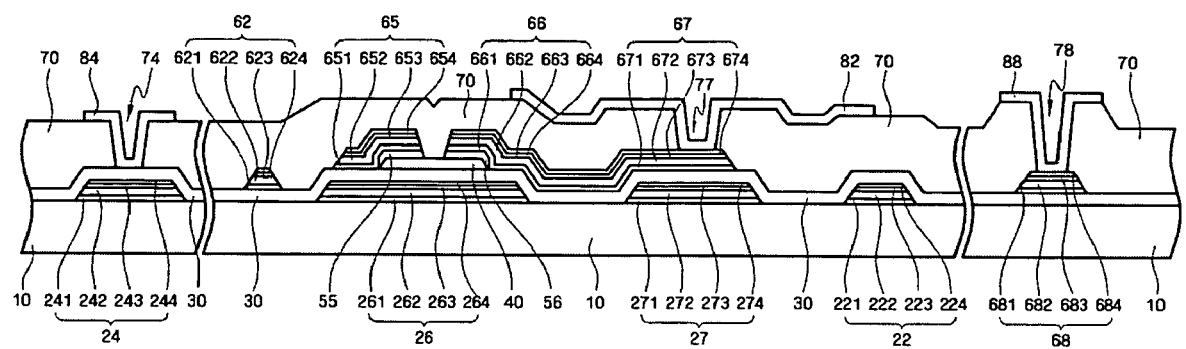
FIG. 6B is a sectional view taken along a line B-B' of FIG. 6A.

Referring to FIGS. 6A and 6B, a plurality of gate wires for gate signal transmission are disposed on an insulating substrate 10. A gate wire includes a gate line 22 extending in a transverse direction, a gate pad 24, connected to an end of the gate line 22, receiving a gate signal from an external source and transmitting the received gate signal to the gate line 22, a gate electrode 26 of a TFT, which is connected to the gate line 22 and has a protrusion shape, and a storage electrode 27 and a storage electrode line 28 parallel to the gate line 22. The storage electrode line 28 extends in a transverse direction across a pixel region and is connected to the storage electrode 27 that is wider than the storage electrode line 28. The storage electrode 27 overlapping a drain electrode extension portion 67 connected with the pixel electrode 82, which will later be described, forms a storage capacitor that enhances a charge storage capacity of a pixel. The shapes and arrangement of the storage electrode 27 and the storage electrode line 28 may vary. When a storage capacitor generated by the overlapping of the pixel electrode 82 and the gate line 22 is sufficient, formation of the storage electrode 27 may be omitted.

As shown in FIG. 6B, the gate wire (22, 24, 26, and 27) is formed in four-layered structures composed of barrier layers 221, 241, 261, and 271, copper conductive layers 222, 242, 262, and 272 made of copper or its alloy, copper nitride-containing intermediate layers 223, 243, 263, and 273, and capping layers 224, 244, 264, and 274. Although not directly shown in the drawing, the storage electrode line 28 has the same multi-layered structure as the gate wire (22, 24, 26, and 27). In the gate wire having the multi-layered structures which are described below, the storage electrode line 28 is also included and multi-layered characteristics of the gate wire (22, 24, 26, and 27) holds true for the storage electrode line 28 as well.

The wire structure of the present invention as described above with reference to FIGS. 1 through 5 is applied to the multi-layered gate wire. Here, the capping layers 224, 244, 264, and 274 assist adhesion of the overlying conductive layers 222, 242, 262, and 272 to the insulating substrate 10 and deter materials forming the insulating substrate 10 and the conductive layers 222, 242, 262, and 272 from being diffused into each other. In addition, the intermediate layers 223, 243, 263, and 273 interposed between the copper conductive layers 222, 242, 262, and 272 and the capping layers 224, 244, 264, and 274 deter galvanic corrosion caused by electron exchange. Meanwhile, since the insulating substrate 10 directly below the gate wire (22, 24, 26, 27, and 28) is not significantly affected by penetration of copper ions during etching, the barrier layers 221, 241, 261, and 271 may also be made of a material capable of being etched together with the copper conductive layers 222, 242, 262, and 272, like the capping layers 224, 244, 264, and 274.

A gate insulating layer 30 made of silicon nitride (SiNx) is disposed on the substrate 10 and the gate wire (22, 24, 26, 27, and 28).

An island-shaped semiconductor layer 40 made of a semiconductor material such as hydrogenated amorphous silicon is disposed on a portion of the gate insulating layer 30 corresponding to the gate electrode 26. Ohmic contact layers 55 and 56 made of silicide or n+ hydrogenated amorphous silicon heavily doped with n-type impurity are disposed on the semiconductor layer 40.

A data wire (62, 65, 66, 67, and 68) is disposed on the ohmic contact layers 55 and 56 and the gate insulating layer 30. The data wire includes a data line 62 substantially extending in a longitudinal direction and intersecting a gate line 22 to locate pixels, a source electrode 65 connected to the data line 62 and extending over the ohmic contact layer 55, a data pad 68 connected to an end of the data line 62 and receiving a picture signal from external circuits, a drain electrode 66 spaced apart from the source electrode 65 and formed on the ohmic contact layer 56 to be opposite to the source electrode 65 in view of the gate electrode 26, and a drain electrode extension portion 67 extending from the drain electrode 66 and having a large area overlapping the storage electrode 27.

The data wire (62, 65, 66, 67, and 68), like the gate wire (22, 24, 26, and 27), has a four-layered structure composed of barrier layers 621, 651, 661, 671, and 681, copper conductive layers 622, 652, 662, 672, and 682 made of copper or its alloy, copper nitride-containing intermediate layers 623, 653, 663, 673, and 683, and capping layers 624, 654, 664, 674, and 684. The wire structure of the present invention as described above with reference to FIGS. 1 through 5 is applied to the multi-layered data wire (62, 65, 66, 67, and 68). Here, the barrier layers 621, 651, 661, 671, and 681 assist adhesion of the conductive layers 622, 642, 662, 672, and 682 to a lower structure, that is, the ohmic contact layers 55 and 56 and the gate insulating layer 30 and deter materials forming the ohmic contact layers 55 and 56, the gate insulating layer 30 and the conductive layers 622, 642, 662, 672, and 682 from being diffused into each other. In addition, the barrier layers 621, 651, 661, 671, and 681 deter TFT characteristics from deteriorating due to penetration of copper ions dissolved in an etchant into the ohmic contact layers 55 and 56, constituting a channel portion of a TFT, and the semiconductor layer 40 disposed under the ohmic contact layers 55 and 56, the etchant used in a subsequent process, that is, in a wet etching process performed on the data wire (62, 65, 66, 67, and 68), particularly to form the source electrode 65 and the drain electrode 66 in the channel portion. The intermediate layers 223, 243, 263, and 273 interposed between the copper conductive layers 222, 242, 262, and 272 and the capping layers 224, 244, 264, and 274 deter galvanic corrosion caused by electron exchange.

The source electrode 65 overlaps at least a portion of the semiconductor layer 40. The drain electrode 66 is opposite to the source electrode 65 with respect to the gate electrode 26 and overlaps at least a portion of the semiconductor layer 40. Here, the ohmic contact layers 55 and 56 exist between the underlying semiconductor layer 40 and the overlying source electrode 65 and the drain electrode 66 to reduce the contact resistance therebetween.

The drain electrode extension portion 67 overlaps the storage electrode 27 to form a storage capacitance with the gate insulating layer 30 interposed between the drain electrode extension portion 67 and the storage electrode 27. In the absence of the storage electrode 27, the drain electrode extension portion 67 may not be formed.

The gate electrode 26, the semiconductor layer 40, the ohmic contact layers 55 and 56, the source electrode 65, and the drain electrode 66 constitute a TFT. At this time, the semiconductor layer 40 forms a channel region of the TFT. The TFT of this embodiment is a "bottom gate mode" TFT in which the gate electrode 26 is disposed under the semiconductor layer 40 including a channel region.

A passivation layer 70 is formed on the data wire (62, 65, 66, 67, and 68), and unexposed portions of the semiconductor layer 40. Here, the passivation layer is preferably made of an inorganic insulator such as silicon nitride or silicon oxide, a photosensitive organic material having a good flatness characteristic, or a low dielectric insulating material such as a-Si:C:O and a-Si:O:F formed by plasma enhanced chemical vapor deposition (PECVD). When the passivation layer 70 is made of an organic material, an insulation layer (not shown) made of silicon nitride (SiNx) or silicon oxide (SiO2) may further be provided under the organic layer in order to deter an organic material of the passivation layer 70 from contacting an exposed portion of the semiconductor layer 40 between the source electrode 65 and the drain electrode 66.

Contact holes 77 and 78 exposing the drain electrode extension portion 67 and the data pad 68 are present in the passivation layer 70. A contact hole 74 exposing the gate pad 24 is present in the passivation layer 70 and the gate insulating layer 30. A pixel electrode 82 electrically connected to the drain electrode 66 via the contact hole 77 is disposed on a portion of the passivation layer 70 corresponding to each pixel. Electric fields are generated between the pixel electrode 82 supplied with the data voltages and a common electrode of an upper display substrate, which determine an orientation of liquid crystal molecules in the LC layer between the pixel electrode 82 and the common electrode.

An auxiliary gate pad 84 and an auxiliary data pad 88 connected to the gate pad 24 and the data pad 68 via the contact holes 74 and 78, respectively, are also disposed on the passivation layer 70. The pixel electrode 82, the auxiliary gate pad 84, and the auxiliary data pad 88 are made of indium tin oxide (ITO).

The TFT substrate according to an embodiment of the present invention can be applied to liquid crystal display (LCD) devices.

Hereinafter, a method of manufacturing a TFT substrate according to one embodiment of the present invention will be described in more detail with reference to FIGS. 6A, 6B, and 7A through 10B. FIGS. 7A, 8A, 9A, and 10A are sequential layouts illustrating a method of manufacturing the TFT substrate shown in FIG. 6A and FIGS. 7B, 8B, 9B, and 10B are sectional views taken along lines B-B' of FIGS. 7A, 8A, 9A, and 10A, respectively.

Figure 7A:
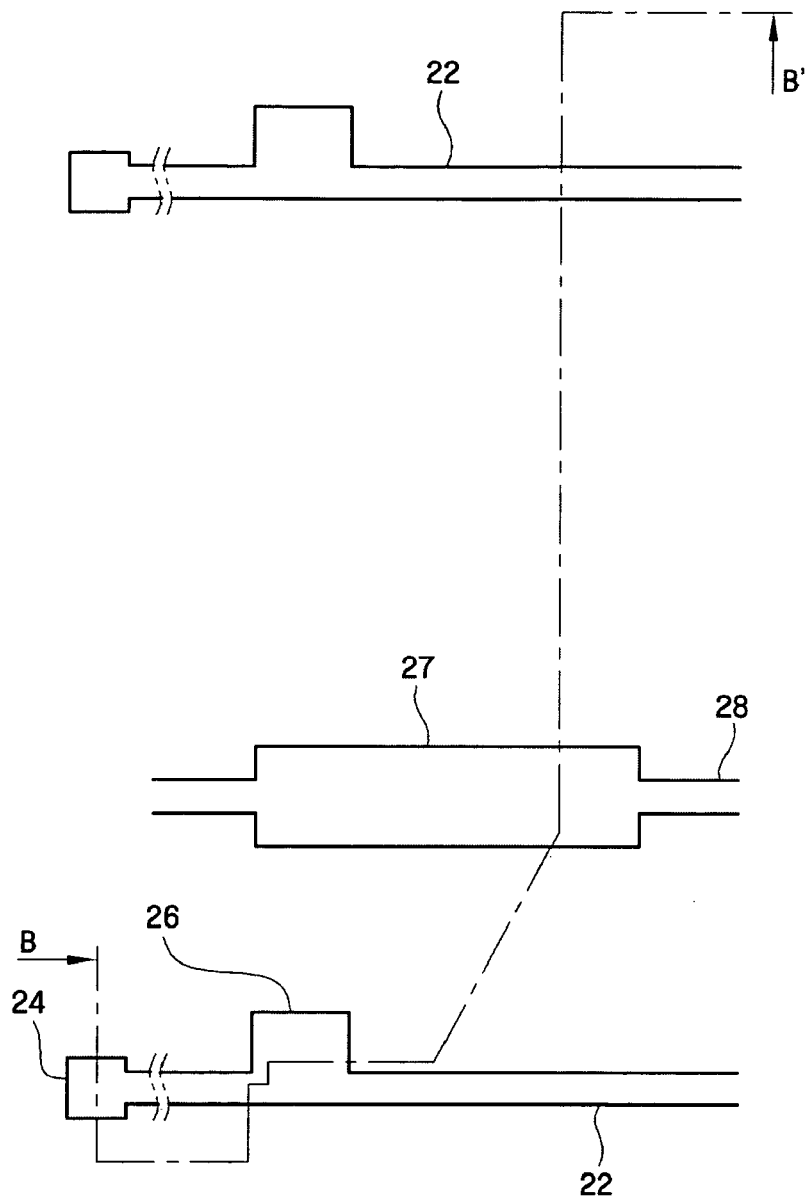
FIGS. 7A, 8A, 9A, and 10A are sequential layouts illustrating a method of manufacturing the TFT substrate shown in FIG. 6A.
Figure 7B:
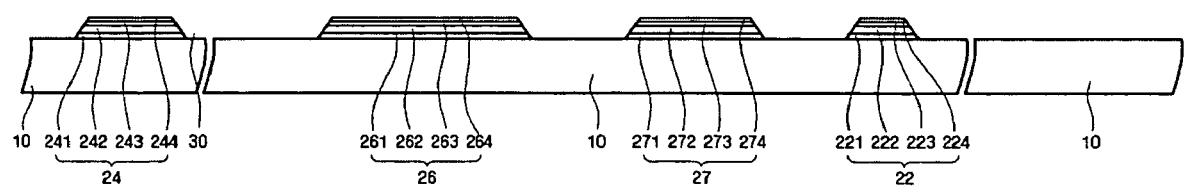
FIGS. 7B, 8B, 9B, and 10B are sectional views taken along lines B-B' of FIGS. 7A, 8A, 9A, and 10A, respectively.

First, referring to FIGS. 7A and 7B, a four-layered gate layer is formed by sequentially stacking a barrier layer, a copper conductive layer containing copper or its alloy, an intermediate layer containing copper nitride, and a capping layer are on an insulating substrate 10 using, for example, sputtering. Then, a photoresist pattern defining a gate wire (22, 24, 26, 27, and 28) is formed on the four-layered gate layer. Then, the capping layer, the intermediate layer, and the copper conductive layer are sequentially wet-etched using the photoresist pattern as an etching mask to thereby expose the barrier layer. Then, the barrier layer is dry-etched using the photoresist pattern as an etching mask, and the photoresist pattern is removed. This completes the gate wire (22, 24, 26, 27, and 28) including a gate line 22, a gate electrode 26, a gate pad 24, a storage electrode 27, and a storage electrode line 28. The above-described method of forming the wire is applied to the formation of the gate wire (22, 24, 26, 27, and 28). Thus, as described above with reference to FIG. 1, the gate wire (22, 24, 26, 27, and 28) exhibit a good lateral profile without lateral corrosion and a good taper angle without overhangs since intermediate layers 223, 243, 263, and 273 interposed between copper conductive layers 222, 242, 262, and 272 and capping layers 224, 244, 264, and 274 deter an electron transfer during wet-etching and photoresist pattern removal, and thus deter galvanic corrosion.

Figure 8A:
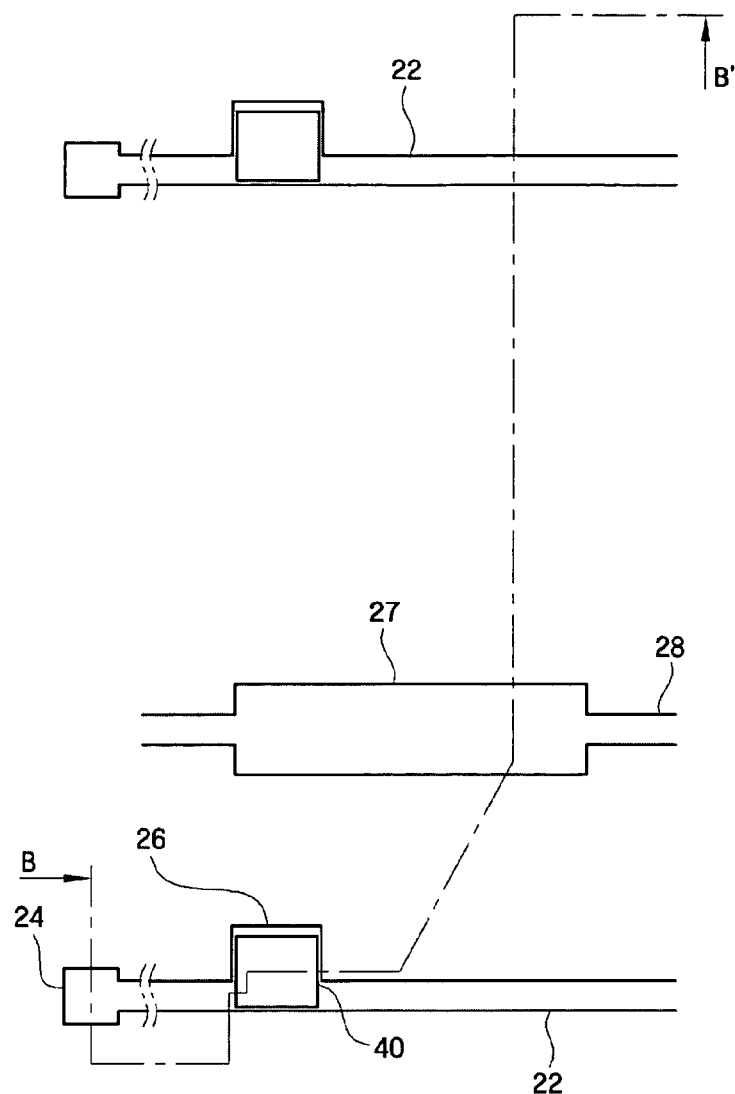
Figure 8B:
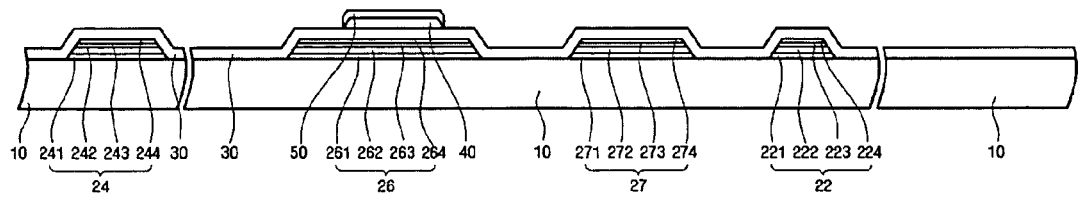

Next, referring to FIGS. 8A and 8B, a gate insulating layer 30 made of, for example, silicon nitride, an intrinsic amorphous silicon layer, and a doped amorphous silicon layer are continuously deposited to a thickness of about 1,500 to about 5,000 angstroms, about 500 to about 2,000 angstroms, and about 300 to about 600 angstroms, using, for example, chemical vapor deposition (CVD). The intrinsic amorphous silicon layer and the doped amorphous silicon layer are etched using photolithography to form an island-shaped semiconductor layer 40 and a doped semiconductor layer 50 on a portion of the gate insulating layer 30 corresponding to the gate electrode 26.

Figure 9A:
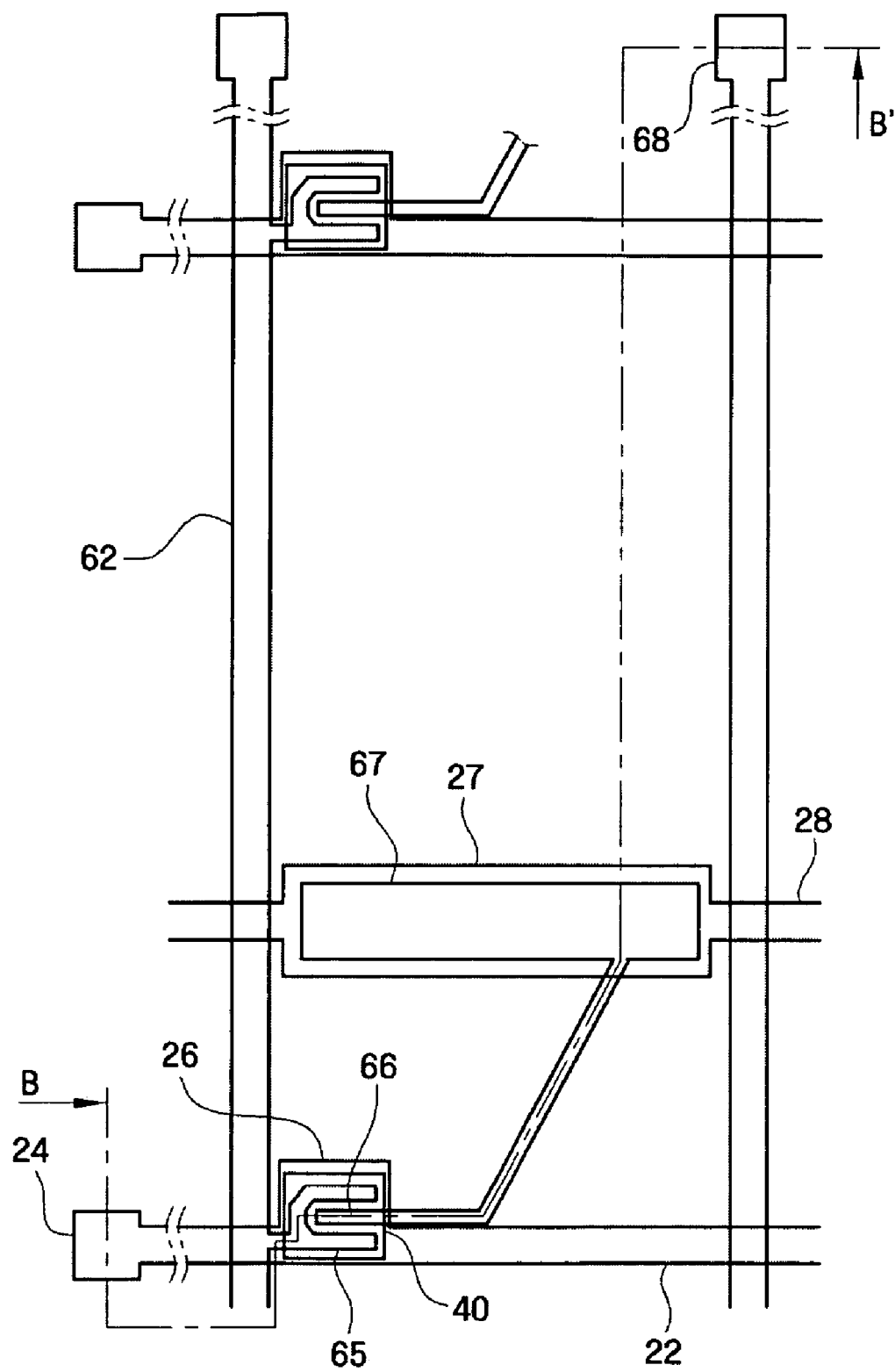
Figure 9B:
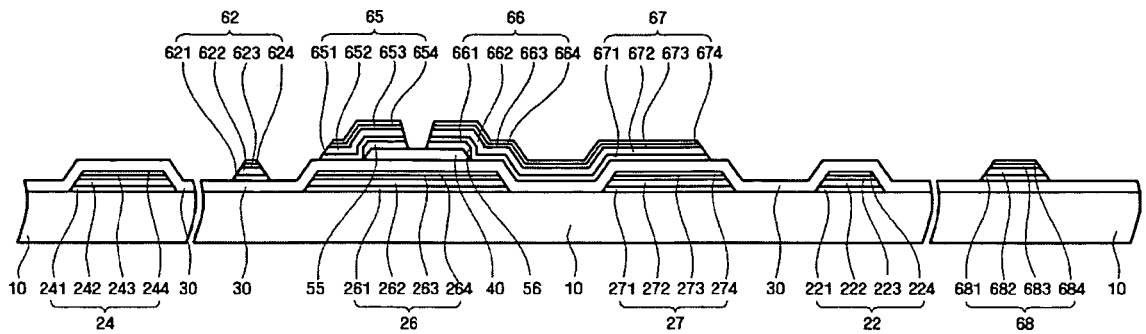

Next, referring to FIGS. 9A and 9B, a four-layered data layer is formed by sequentially forming a barrier layer, a copper conductive layer including copper or its alloy, an intermediate layer including copper nitride, and a capping layer on the gate insulating layer 30 and the doped semiconductor layer 50 using, for example, sputtering. Then, a photoresist pattern defining a data wire (62, 65, 66, 67, and 68) is formed on the four-layered data layer. Then, the capping layer, the intermediate layer, and the copper conductive layer are sequentially wet-etched using the photoresist pattern as an etching mask to thereby expose the barrier layer. Then, the barrier layer is dry-etched using the photoresist pattern as an etching mask. This completes the data wire (62, 65, 66, 67, and 68) including a data line 62, a source electrode 65, a drain electrode 66, a drain electrode extension portion 67, and a data pad 68 composed of barrier layers 621, 651, 661, 671, and 681, copper conductive layers 622, 652, 662, 672, and 682, intermediate layers 623, 653, 663, 673, and 683, and capping layers 624, 654, 664, 674, and 684, respectively. The above-described method of forming the wire is applied to the formation of the data wire (62, 65, 66, 67, and 68). Thus, as described above with reference to FIG. 1, the data wire (62, 65, 66, 67, and 68) exhibit a good lateral profile without lateral corrosion and a good taper angle without overhangs since the intermediate layers 623, 653, 663, 673, and 683 interposed between the copper conductive layers 622, 652, 662, 672, and 682 and the capping layers 624, 654, 664, 674, and 684 deter an electron transfer during wet-etching and photoresist pattern removal, and thus deter galvanic corrosion. In addition, while the copper conductive layers 622, 652, 662, 672, and 682 are wet-etched, the doped semiconductor layer 50 is covered with the barrier layers 621, 651, 661, 671, and 681. Therefore, the doped semiconductor layer 50 may be protected from penetration of copper ions dissolved in the etchant.

After the dry etching of the barrier layers 621, 651, 661, 671, and 681, unexposed portions of the doped semiconductor layer 50, that is, portions that are not covered by the data wire (62, 65, 66, 67, and 68), is dry-etched to form ohmic contact layers 55 and 56 with respect to the gate electrode 26 and to expose the semiconductor layer 40. Here, the etching gas used when etching the barrier layers 621, 651, 661, 671, and 681 can also be used in dry etching of the doped semiconductor layer 50, or etching can be continuously performed just by replacing the etching gas with another etching gas. This completes a bottom gate mode TFT wherein the semiconductor layer 40, the ohmic contact layers 55 and 56, the source electrode 65, and the drain electrode 66 are disposed on the gate electrode 26, and the gate electrode 26 is disposed under the channel region of the semiconductor layer 40.

Figure 10A:
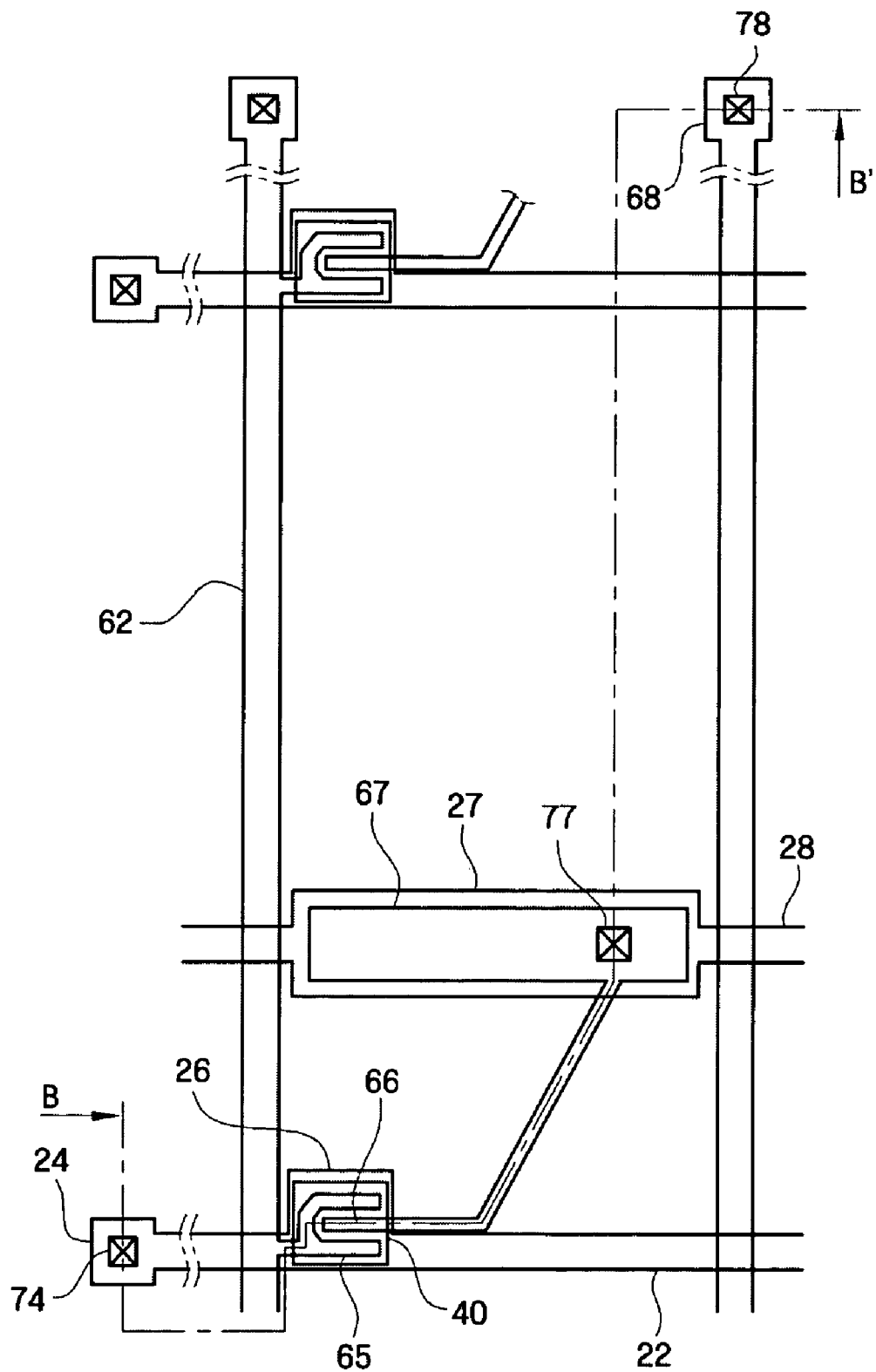
Figure 10B:
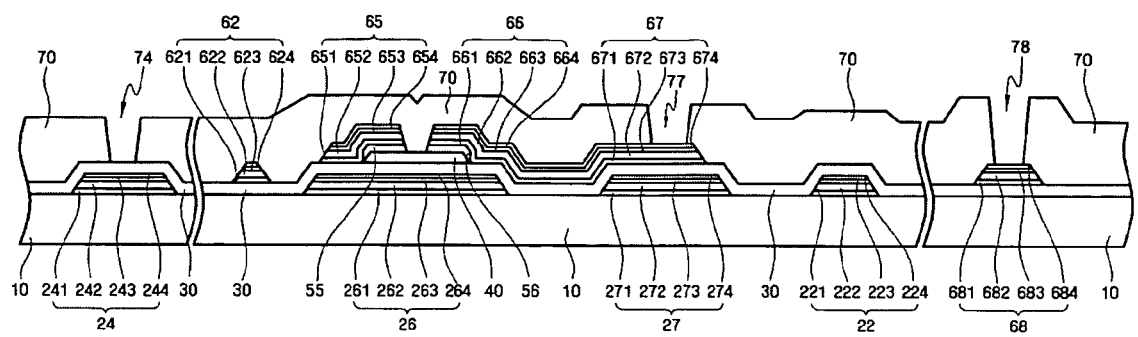

Next, referring to FIGS. 10A and 10B, a passivation layer 70 is formed as a single layer or a multiple layer made of an organic material with good planarization characteristics and photosensitive property, a low-dielectric insulating material (e.g., a-Si:C:O, a-Si:O:F) capable of being deposited by plasma-enhanced CVD (PECVD), or an inorganic material such as silicon nitride (SiNx).

Then, the passivation layer 70, together with the gate insulating layer 30, is patterned using photolithography to form contact holes 74, 77, and 78 exposing the gate pad 24, the drain electrode extension portion 67, and the data pad 68, respectively. When the passivation layer 70 is made of an organic material with photosensitive property, the contact holes 74, 77, and 78 can be formed using only photolithography. At this time, the photolithography may be performed under an etching condition such that the etching ratio for the gate insulating layer 30 and the passivation layer 70 is substantially the same.

Finally, as shown in FIGS. 6A and 6B, an ITO film is deposited and etched using photolithography to form the pixel electrode 82, the auxiliary gate pad 84, and the auxiliary data pad 88 connected to the drain electrode 66, the gate pad 24, and the data pad 68 via the contact holes 77, 74, and 78, respectively.

Figure 11A:
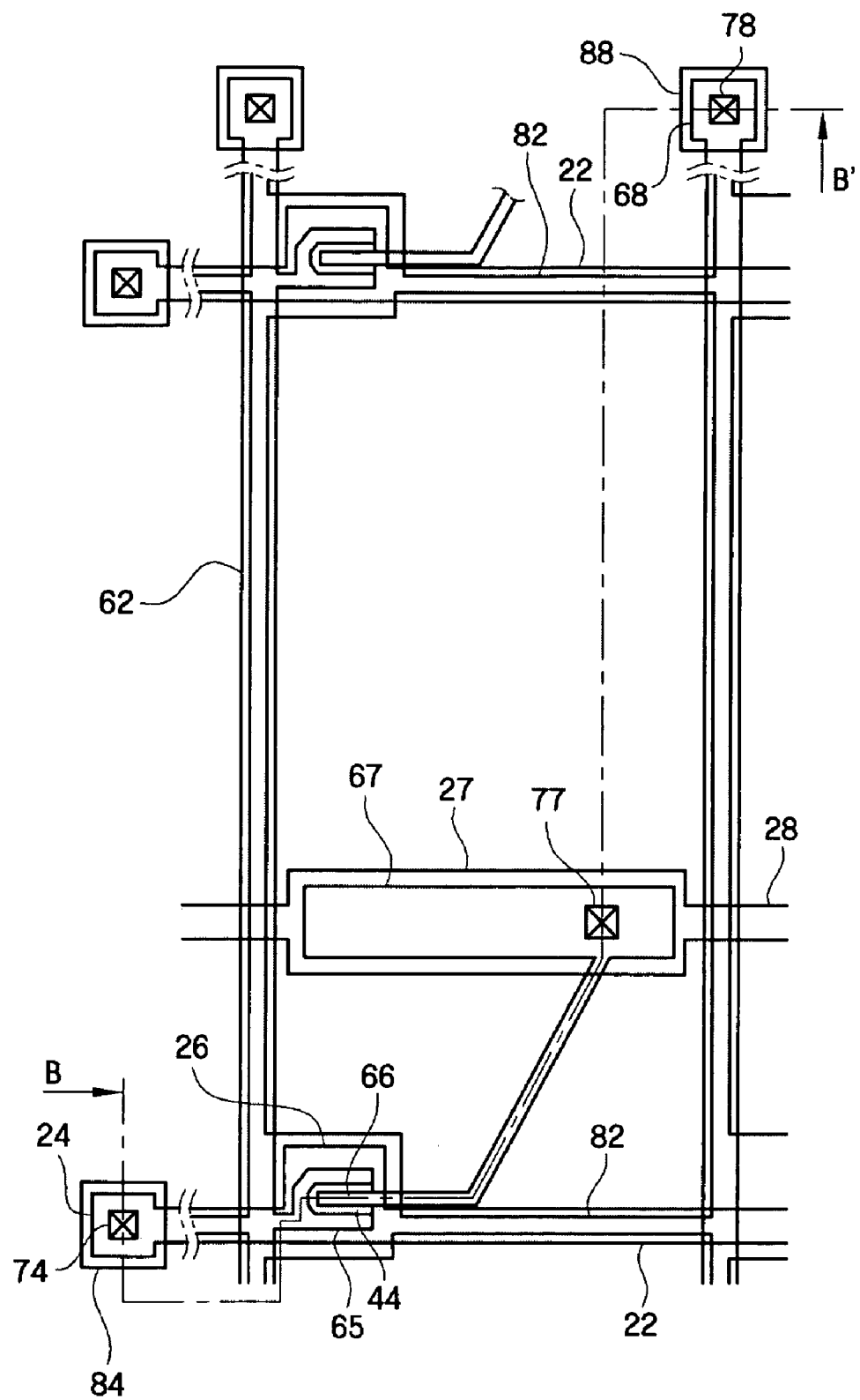
FIG. 11A is a layout of a modified example of the TFT substrate shown in FIG. 6A.
Figure 11B:
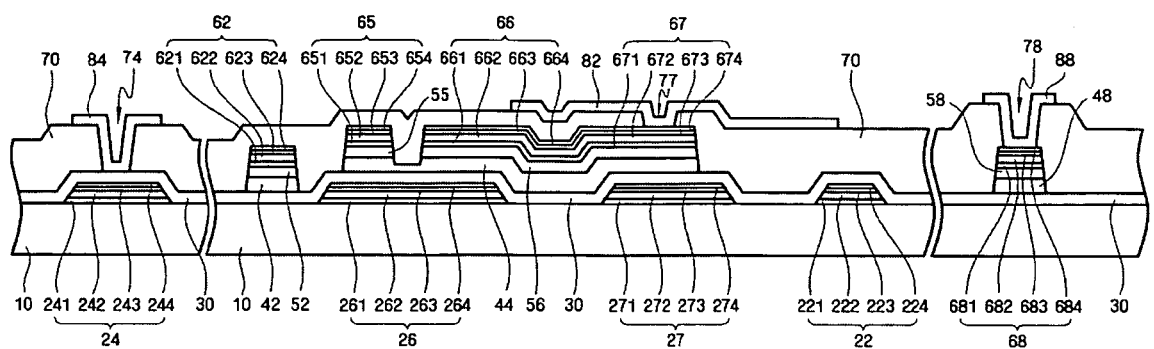
FIG. 11B is a sectional view taken along a line B-B' of FIG. 11A.

Although the semiconductor layer is formed in the shape of an island and the TFT substrate whose pattern is different from that of the data wire and a method for fabricating the TFT substrate are described in the illustrative embodiment of the present invention, the present invention can also be applied to a TFT substrate having a semiconductor layer and a data wire having substantially the same patterns and a method for fabricating the TFT substrate thereof, which will be described with reference to FIGS. 11A and 11B. FIG. 11A is a layout of a modified example of the TFT substrate shown in FIG. 6A, and FIG. 11B is a sectional view taken along a line B-B' of FIG. 11A.

Referring to FIGS. 11A and 11B, the illustrated TFT substrate has substantially the same structure as the modified TFT substrate illustrated in FIGS. 6A and 6B except that semiconductor layers 42, 44 and 48, and ohmic contact layers 52, 55, 56, and 58 are formed in substantially the same patterns, that is, in line patterns, as the data wire (62, 65, 66, 67, and 68). However, the ohmic contact layers 52, 55, 56, and 68 substantially have the same patterns as the data wire (62, 65, 66, 67, and 68) but are different in that the semiconductor layer 44 is not disconnected at the channel portion. Unlike in the fabrication method of the TFT substrate according to an embodiment of the present invention in which different masks are used to form a semiconductor layer and a data wire, in the fabrication method of the TFT substrate according to another embodiment of the present invention, a data wire, ohmic contact layers, and data lines are patterned using a single mask including a slit or semi-permeable membrane.

Figure 12A:
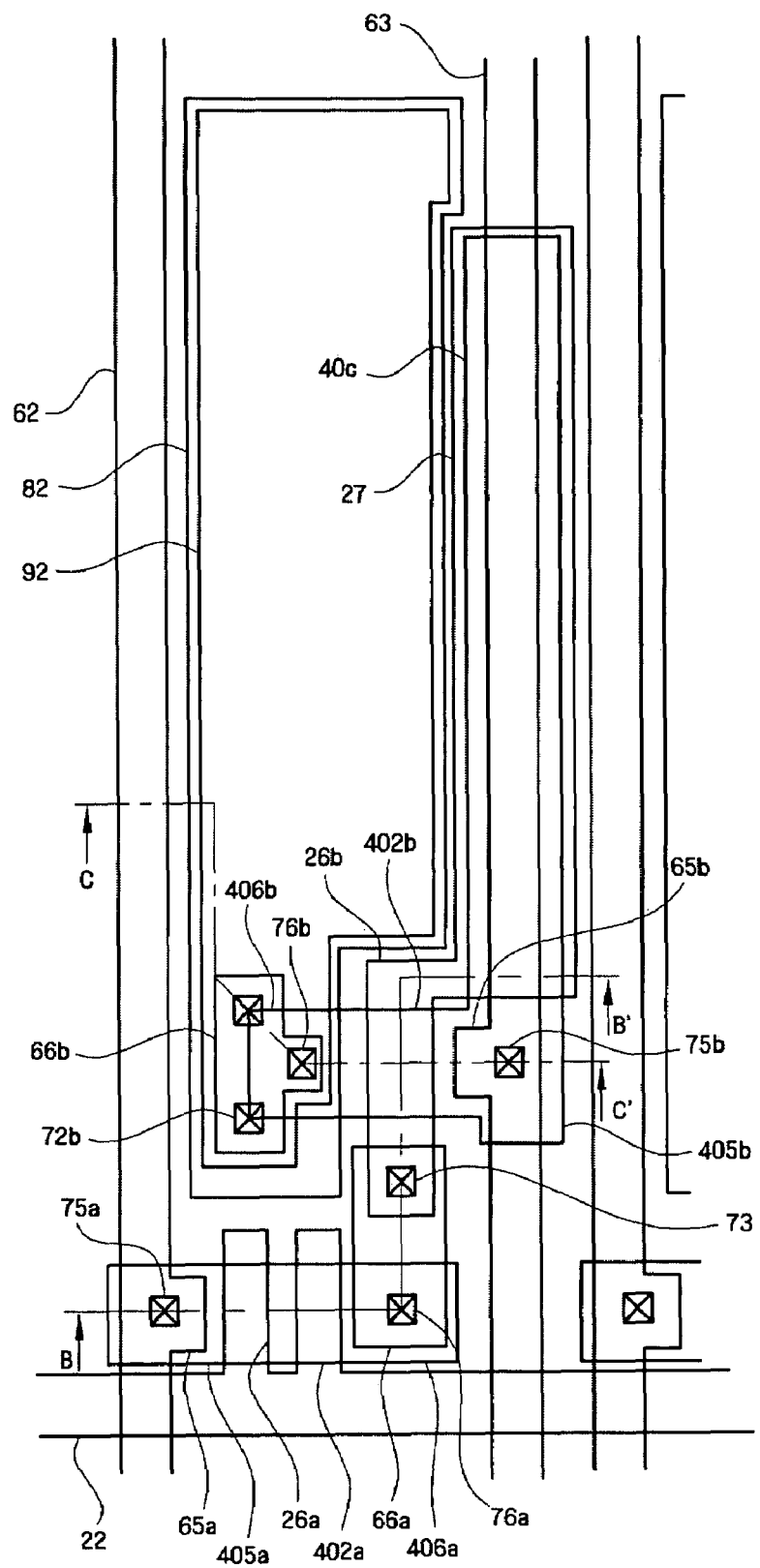
FIG. 12A is a layout of a TFT substrate according to another embodiment of the present invention.

Hereinafter, a TFT substrate according to another embodiment of the present invention will be described with reference to FIGS. 12A through 12C. The TFT substrate according to another embodiment of the present invention is used for organic EL display devices and includes the wire structure according to an embodiment of the present invention. FIG. 12A is a layout of a TFT substrate according to another embodiment of the present invention, and FIGS. 12B and 12C are respective sectional views taken along lines B-B' and C-C' of FIG. 12A.

Figure 12B:
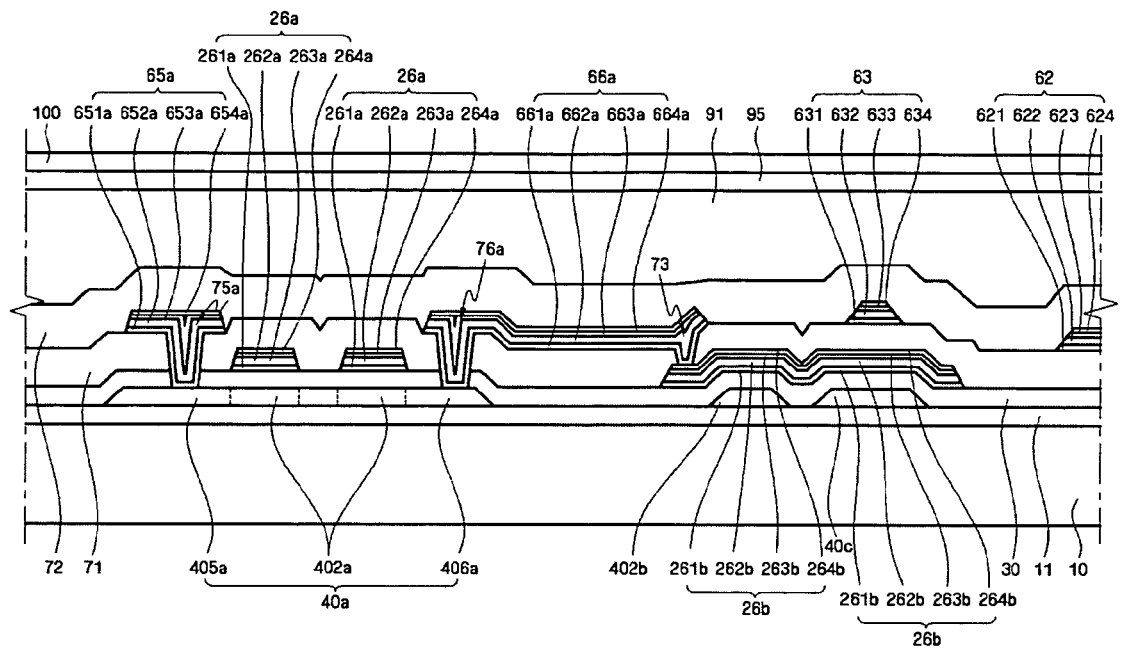
FIGS. 12B and 12C are respective sectional views taken along lines B-B' and C-C' of FIG. 12A.
Figure 12C:
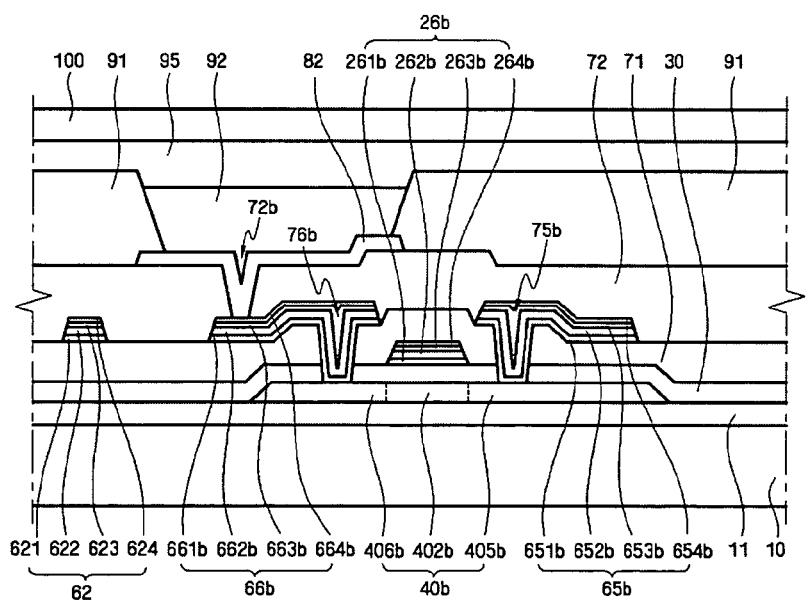

Referring to FIGS. 12A through 12C, a blocking layer 11 made of silicon oxide or silicon nitride is disposed on an insulating substrate 10. First and second semiconductor layers 40a and 40b made of, for example, polycrystalline silicon are disposed on the blocking layer 11. The second semiconductor layer 40b is connected to a capacitor semiconductor layer 40c made of, for example, polycrystalline silicon. The first semiconductor layer 40a includes first TFT portions 405a, 406a, and 402a, and the second semiconductor layer 40b includes second TFT portions 405b, 406b, and 402b. The first TFT portion 405a of the first TFT portions 405a, 406a, and 402a, referred to as a first source region, and the region 406a, referred to as a first drain region, are doped with n-type impurities, and the second TFT portion 405b of the second semiconductor layer 40b, referred to as a second source region, and the region 406b, referred to as a second drain region, are doped with p-type impurities. According to driving conditions, the first source and drain regions 405a and 406a may be doped with p-type impurities and the second source and drain regions 405b and 406b may be doped with n-type impurities.

A gate insulating layer 30 made of silicon oxide or silicon nitride is disposed on the semiconductor layers 40a, 40b, and 40c.

On the gate insulating layer 30, there are disposed a gate wire including a gate line 22 extending in a transverse direction, a first gate electrode 26a connected to the gate line 22, having a protrusion shape and overlapping the channel region 402a of a first TFT, a second gate electrode 26b isolated from the gate line 22 and overlapping the channel region 402b of a second TFT, and a storage electrode 27 connected to the second gate electrode 26b and overlapping the underlying capacitor semiconductor layer 40c.

The gate wire (22, 26a, 26b, and 27) has four-layered structures composed of barrier layers 261a, 261b, and 271, copper conductive layers 262a, 262b, and 272 made of copper or its alloy, intermediate layers 263a, 263b, and 273 including copper nitride, and capping layers 264a, 264b, and 274. Although not shown, the gate line 22 also has the same structure as the gate wire (26a, 26b, and 27). In the gate wire (26a, 26b, and 27) having the multi-layered structure which is described below, the gate line 22 is also included and multi-layered characteristics of the gate wire (26a, 26b, and 27) holds true for the gate line 22 as well.

The wire structure of the present invention as described above with reference to FIGS. 1 through 5 is applied to the four-layered gate wire (22, 26a, 26b, and 27). Here, the barrier layers 261a, 261 b, and 271 assist an adhesion of the copper conductive layers 262a, 262b, and 272 to the gate insulating layer 30, and deter an inter-diffusion between a material constituting the insulating substrate 10 and a material constituting the copper conductive layers 262a, 262b, and 272. The intermediate layers 263a, 263b, and 274 interposed between the copper conductive layers 262a, 262b, and 272 and the capping layers 264a, 264b, and 274 deter galvanic corrosion caused by electron exchange. Meanwhile, since the gate insulating layer 30 directly below the gate wire (22, 26a, 26b, and 27) is not significantly affected by penetration of copper ions during etching, the barrier layers 261a, 261b, and 271 may also be made of a material capable of being etched in the same process together with the copper conductive layers 262a, 262b, and 272, like the capping layers 264a, 264b, and 274.

A first interlayer insulating layer 71 is disposed on the gate insulating layer 30 having thereon the gate wire (22, 26a, 26b, and 27).

A data wire (62, 63, 65a, 65b, 66a, and 66b) is formed on the first interlayer insulating layer 71. The data wire (62, 63, 65a, 65b, 66a, and 66b) includes a data line 62 extending in a longitudinal direction, intersecting the gate line 22, and defining pixels, a driving voltage line 63 supplying a driving voltage, a first source electrode 65a connected to the first source region 405a through a contact hole 75a as a branch of the data line 62, a first drain electrode 66a spaced apart from the first source electrode 65a and connected to the first drain region 406a, a second source electrode 65b connected to the second source region 406a through a contact hole 75b as a branch of the driving voltage line 63, and a second rain electrode 66b spaced apart from the second source electrode 65b and connected to the second drain region 406b. The first drain electrode 66a contacts the first drain region 406a and the second gate electrode 26b through contact holes 76a and 73 passing through the first interlayer insulating layer 71 and the gate insulating layer 30 and electrically connects them. The second drain electrode 66b is electrically connected with the second drain region 406b through the contact hole 76b passing through the first interlayer insulating layer 71 and the gate insulating layer 30.

The data wire (62, 63, 65a, 65b, 66a, and 66b), like the gate wire (22, 26a, 26b, and 27), has a four-layered structure composed of barrier layers 621, 631, 651a, 651 b, 661a, and 661b, copper conductive layers 622, 632, 652a, 652b, 662a, and 662b made of copper or its alloy, intermediate layers 623, 633, 653a, 653b, 663a, and 663b including copper nitride, and capping layers 624, 634, 654a, 654b, 664a, and 664b.

The above-described multi-layered wire structure according to the present invention is applied to the data wire (62, 65, 66, 67, and 68). Here, the barrier layers 621, 631, 651a, 651b, 661a, and 661b assist adhesion of the conductive layers 622, 632, 652a, 652b, 662a, and 662b to a lower structure, that is, the semiconductor layer 405a, 405b, 406a, and 406b and the first interlayer insulating layer 71, and deter materials forming the semiconductor layer 405a, 405b, 406a, and 406b and the first interlayer insulating layer 71 and materials forming the copper conductive layers 622, 632, 652a, 652b, 662a, and 662b from being diffused into each other. In addition, the intermediate layers 623, 633, 653a, 653b, 663a, and 663b, interposed between each of the copper conductive layers 622, 632, 652a, 652b, 662a, and 662b and each of the capping layers 624, 634, 654a, 654b, 664a, and 664b, deter galvanic corrosion caused by electron exchange. Meanwhile, the semiconductor layers 405a, 405b, 406a, and 406b directly below the data wire (62, 63, 65a, 65b, 66a, and 66b) allow the deposition of the data wire (62, 63, 65a, 65b, 66a, and 66b) but are not etched, and the first interlayer insulating layer 71 is not significantly affected by penetration of copper ions during etching. Thus, the barrier layers 621, 631, 651a, 651b, 661a, and 661b may also be made of a material capable of being etched together with the copper conductive layers 622, 632, 652a, 652b, 662a, and 662b, like the capping layers 624, 634, 654a, 654b, 664a, and 664b.

Here, the semiconductor layers 40a and 40b, the first and second gate electrodes 26a and 26b, the first and second source electrodes 65a and 65b, and the first and second drain electrodes 66a and 66b constitute first and second TFTs, respectively. The first TFT is a switching TFT and the second TFT is a driving TFT. In the illustrative embodiment of the present invention, a top gate-type TFT where the gate electrodes 26a and 26b are formed over the semiconductor layers 40a and 40b including the channel portions 402a and 402b, respectively, is adopted.

A second interlayer insulating layer 72 made of silicon nitride, silicon oxide, or an organic insulating material is disposed on the data wire (62, 63, 65a, 65b, 66a, and 66b). The second interlayer insulating layer 72 includes a contact hole 72b exposing the second drain electrode 66b.

A pixel electrode 82 connected to the second drain electrode 66b via the contact hole 72b is disposed on the second interlayer insulating layer 72. The pixel electrode 82 is preferably made of a high reflectivity material such as Al (or Al alloy) or Ag (or Ag alloy). When necessary, the pixel electrode 82 may be made of a transparent conductive material such as ITO or IZO. A material forming the pixel electrode 82 can be appropriately selected according to whether the display device is of a bottom emission type in which a picture is displayed downward the TFT substrate or a top emission type in which a picture is displayed upward the TFT substrate.

A partition wall 91 made of an organic insulating material is formed on the second interlayer insulating layer 72 to separate organic light emitting cells. The partition wall 91 is formed by exposing and developing a photosensitive agent including a black pigment to serve as a blocking layer and simplify its formation process. An organic light emitting layer 92 is formed in a region on the pixel electrode 82 surrounded by the partition wall 91. The organic light emitting layer 92 is made of organic layers that emit one of red, green, and blue, and the red, green, and blue organic layers of the organic light emitting layer 92 are sequentially arranged repetitively.

A buffer layer 95 is disposed on the organic light-emitting layer 92 and the partition wall 91. The buffer layer 95 may be omitted.

A common electrode 100 is formed on the buffer layer 95. The common electrode 100 is made of a transparent conductive material such as ITO or IZO. When the pixel electrode 82 may be made of a transparent conductive material such as ITO or IZO, the common electrode 100 may be made of a high reflectivity material such as Al (or Al alloy) or Ag (or Ag alloy).

The TFT substrate according to another embodiment of the present invention can be applied to an organic EL display device.

Next, a method for fabricating a TFT substrate according to another embodiment of the present invention will be described in detail with reference to FIGS. 12A through 12C and FIGS. 13A through 18C. FIGS. 13A, 14A, 15A, 16A, 17A, and 18A are sequential layouts illustrating a method of manufacturing the TFT substrate shown in FIG. 12A and FIGS. 13B, 14B, 15B, 16B, 17B, and 18B are sequential sectional views taken along lines B-B' of FIGS. 13A, 14A, 15A, 16A, 17A, and 18A, respectively.

Figure 13A:
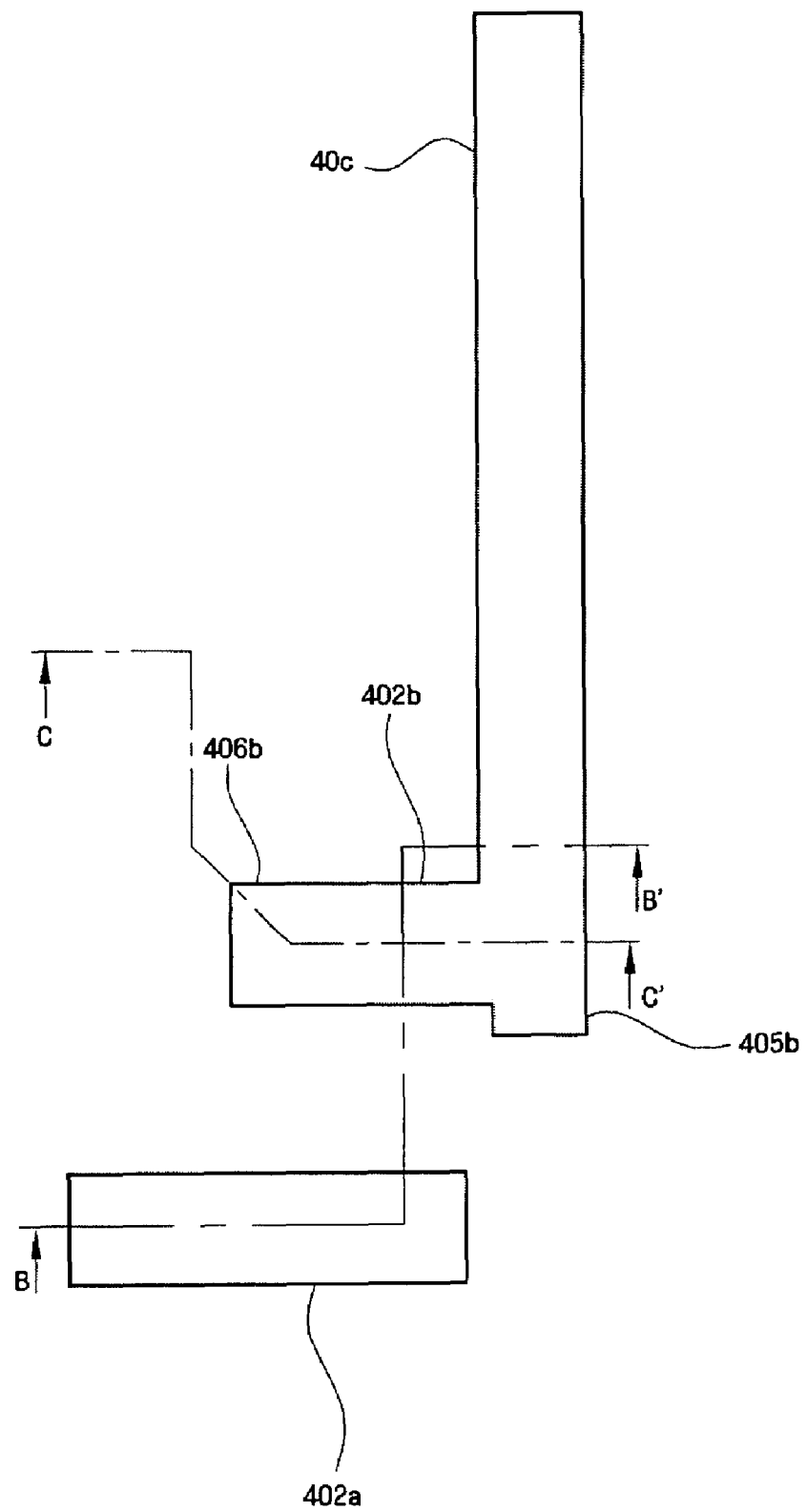
FIGS. 13A, 14A, 15A, 16A, 17A, and 18A are sequential layouts illustrating a method of manufacturing the TFT substrate shown in FIG. 12A.
Figure 13B:
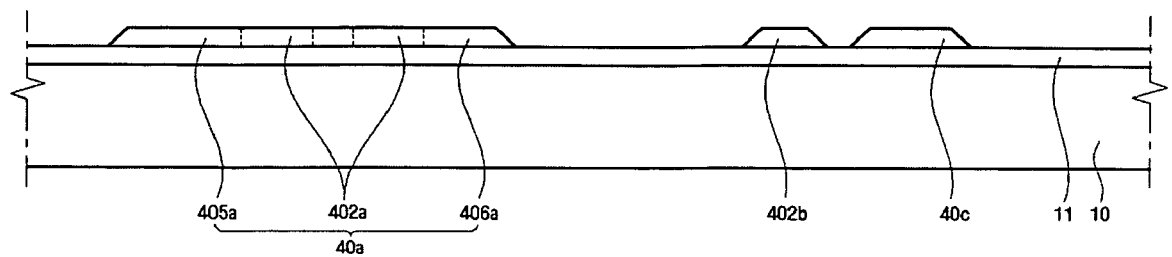
FIGS. 13B, 14B, 15B, 16B, 17B, and 18B are sequential sectional views taken along lines B-B' of FIGS. 13A, 14A, 15A, 16A, 17A, and 18A, respectively.
Figure 13C:
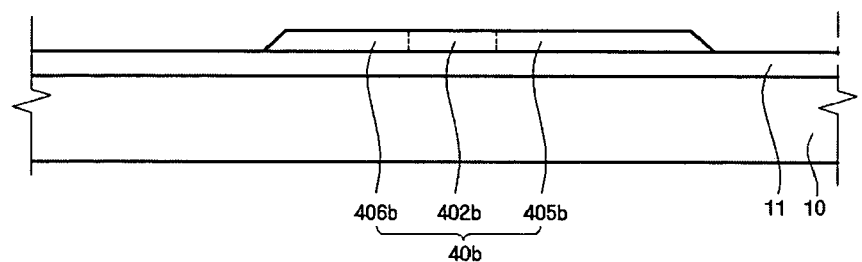
FIGS. 13C, 14C, 15C, 16C, 17C, and 18C are sequential sectional views taken along lines C-C' of FIGS. 13A, 14A, 15A, 16A, 17A, and 18A, respectively.

Referring to FIGS. 13A through 13C, silicon oxide, for example, is deposited on a substrate 10 to form a blocking layer 11. Then, amorphous silicon is deposited on the blocking layer 11 using low-pressure CVD (LPCVD) or plasma-enhanced CVD (PECVD), patterned, and crystallized into polycrystalline silicon using, for example, laser irradiation or annealing, to form semiconductor layers 40a, 40b, and 40c made of polycrystalline silicon.

Figure 14A:
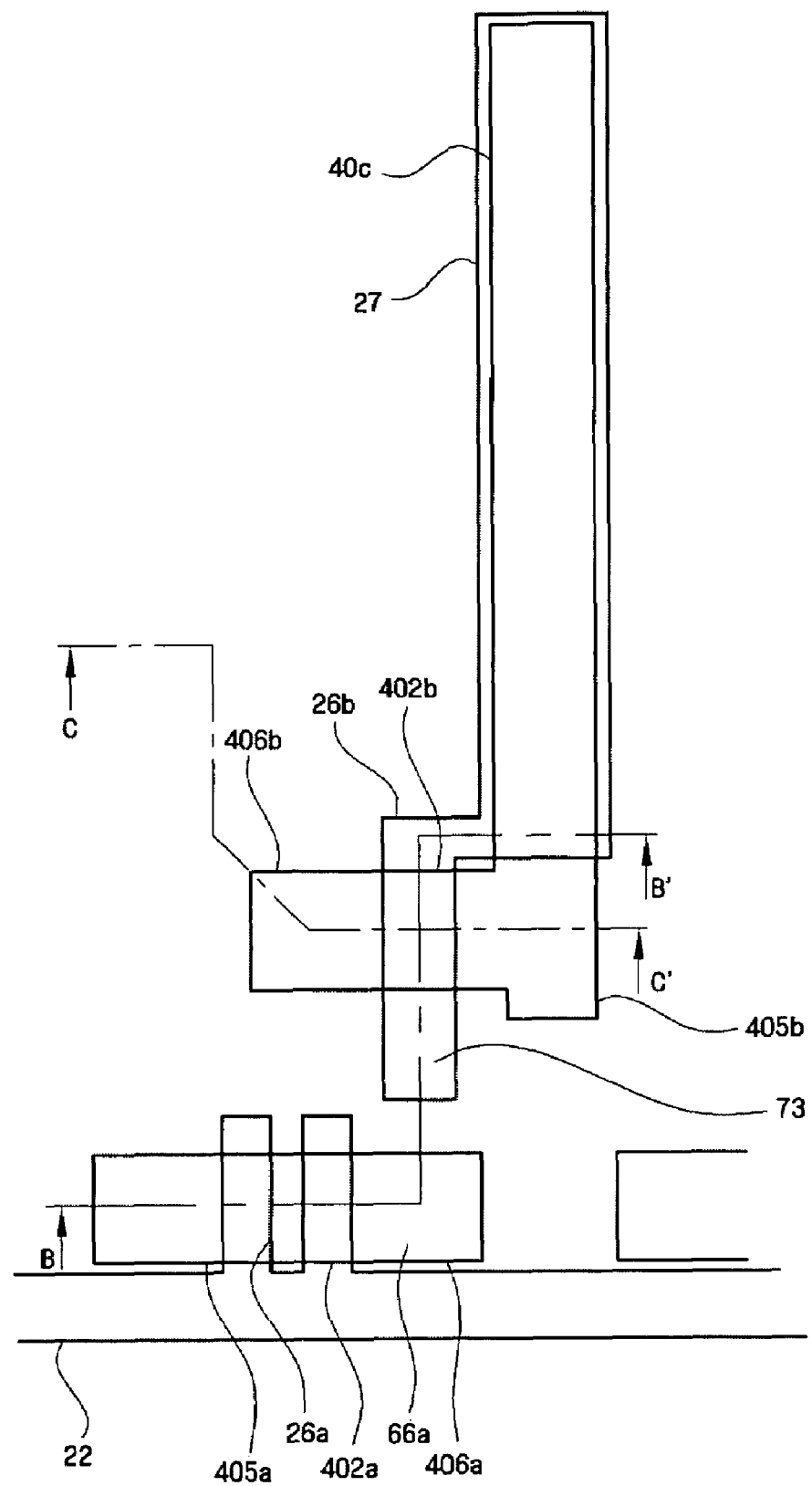
Figure 14B:
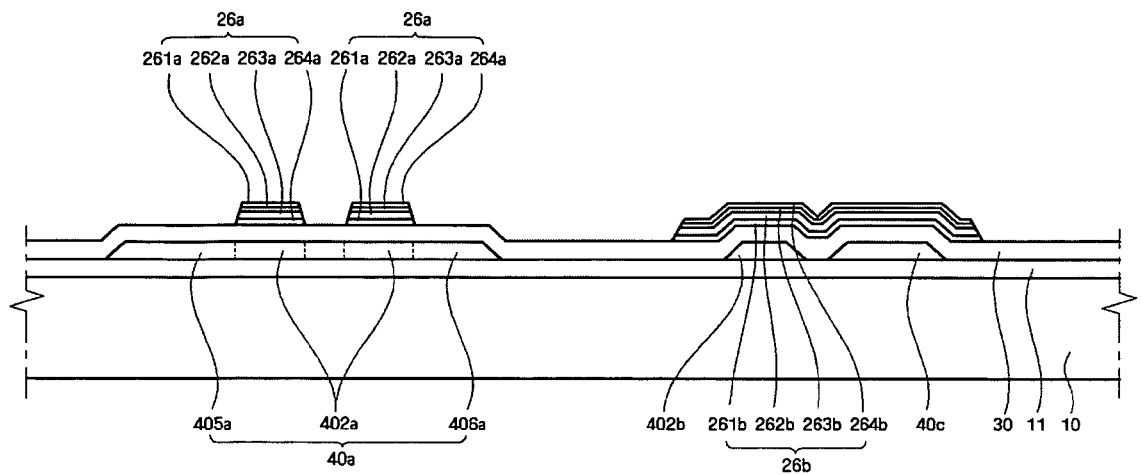
Figure 14C:
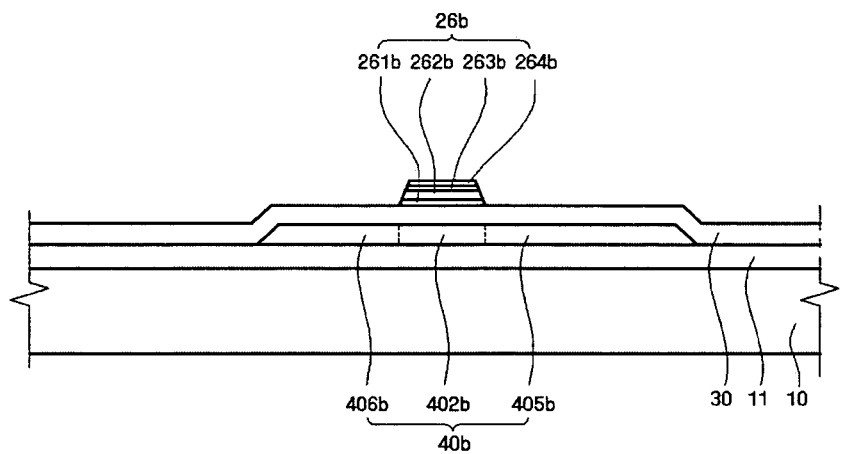

Next, referring to FIGS. 14A through 14C, silicon nitride, for example, is deposited on the blocking layer 11 having thereon the semiconductor layers 40a, 40b, and 40c using, for example, CVD to form a gate insulating layer 30.

Then, a multi-layered gate layer is formed by sequentially stacking barrier layers 261a, 261b, and 271, copper or copper alloy-containing copper conductive layers 262a, 262b, and 272, copper nitride-containing intermediate layers 263a, 263b, and 273, and capping layers 264a, 264b, and 274 using, for example, sputtering.

Then, a first photoresist pattern defining a first gate electrode 26a and a gate line 22 is formed on the multi-layered gate layer. At this time, a region where a second gate electrode 26b and a storage electrode 27 are to be formed, including a channel portion 402a of the second TFT, is covered and protected by the first photoresist pattern. Then, the capping layer 264a, the intermediate layer 263a, and the copper conductive layer 262a are sequentially wet-etched using the first photoresist pattern as an etching mask to expose the barrier layer. Then, the barrier layer 261a is dry-etched using the first photoresist pattern as an etching mask.

Then, an n-type impurity ion is injected into the semiconductor layer 40a of a first TFT to define a channel region 402a under the first gate electrode 26a and to form first source and drain regions 405a and 406a. Then, the first photoresist pattern is removed. This completes the gate line 22, the first gate electrode 26a, and the semiconductor layer 40a including the channel region 402a, the first source region 405a, and the first drain region 406a.

Then, a second photoresist pattern defining a second gate electrode 26b and a storage electrode 27 is formed. At this time, a region where the first gate electrode 26a and the gate line 22 are formed, including the channel portion 402a of the first TFT, is covered and protected by the second photoresist pattern. Then, the capping layers 264b, 274, the intermediate layers 263b, 273, and the copper conductive layers 262b, 272 are sequentially wet-etched using the second photoresist pattern as an etching mask to expose the barrier layers 261b and 271. Then, the barrier layers 261a, 261b and 271 is dry-etched using the second photoresist pattern as an etching mask.

Then, a p-type impurity is injected into the semiconductor layer 40b of a second TFT to define a channel region 402b under the second gate electrode 26b and to form a second source region 405b and a second drain region 406b. Then, the second photoresist pattern is removed. This completes the second gate electrode 26b, the storage electrode 27, and the semiconductor layer 40b including the channel region 402b, the second source region 405b, and the second drain region 406b.

The wire structure according to an exemplary embodiment of the present invention shown in FIG. 1 can also be applied to the gate wire (22, 26a, 26b, and 27). Therefore, the formed gate wire (22, 26a, 26b, and 27) including the copper conductive layers 262a, 262b and 272 is well adhered to a lower structure even after a patterning processing such as wet etching and the removal of a photoresist layer. In addition, the lateral profile of the wire structure has no overhang and has a good tapered angle.

Figure 15A:
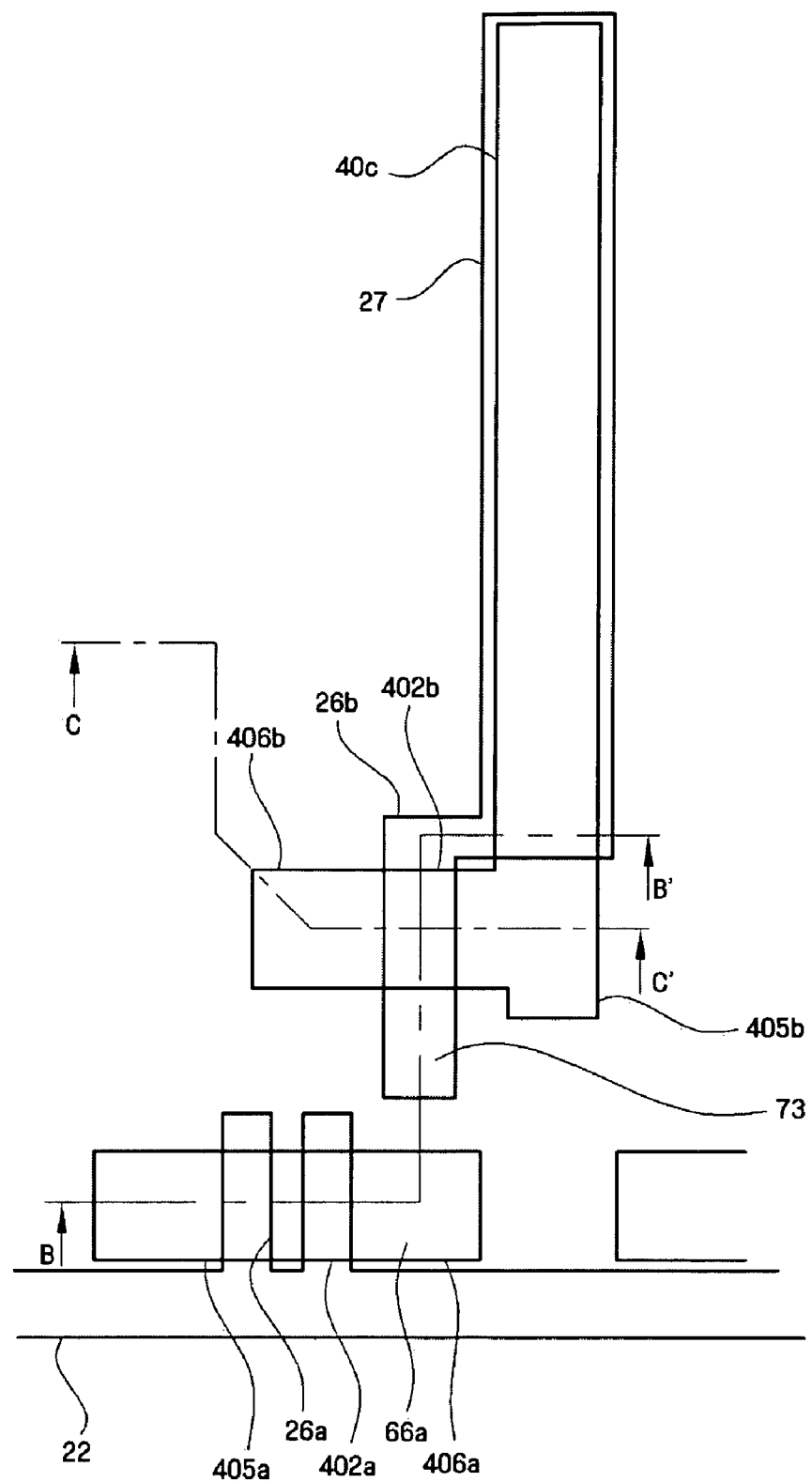
Figure 15B:
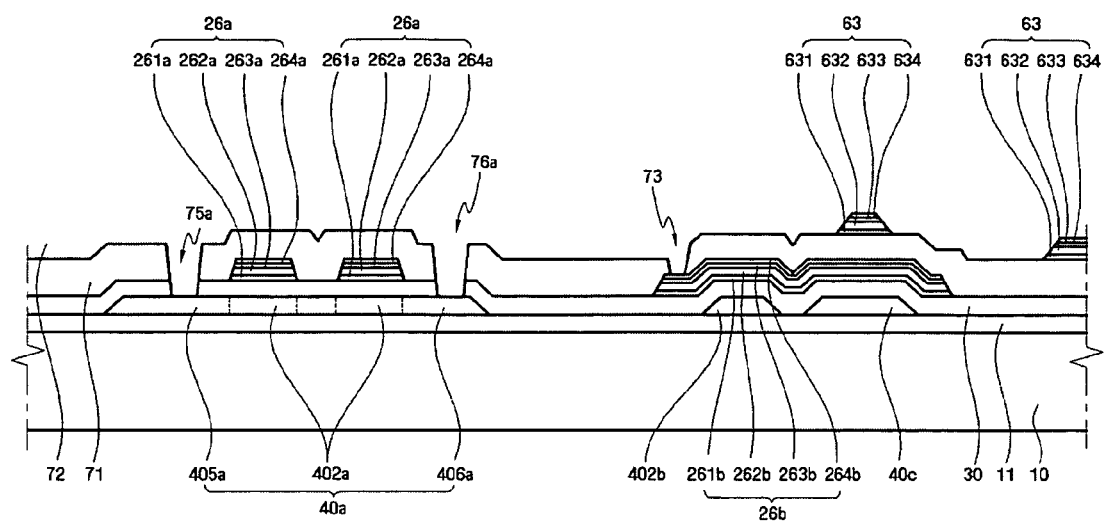
Figure 15C:
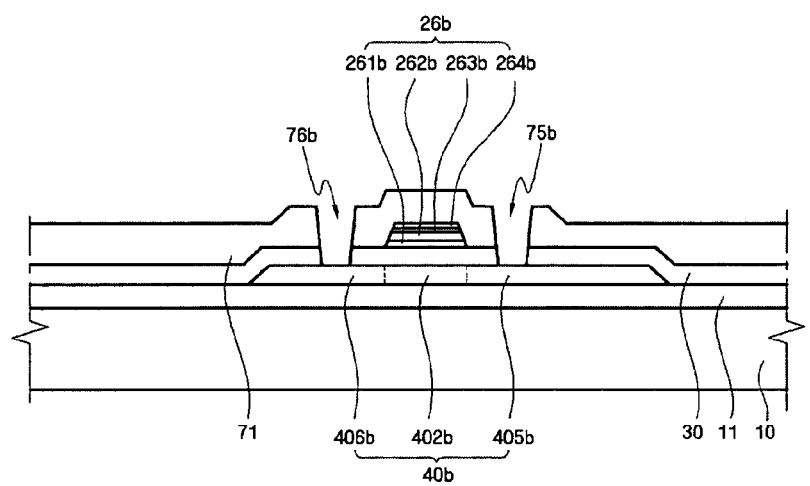

Next, referring to FIGS. 15A through 15C, a first interlayer insulating layer 71 is deposited on the gate insulating layer 30 having thereon the gate wire (22, 26a, 26b, and 27). The first interlayer insulating layer 71, together with the gate insulating layer 30, is etched using photolithography to form contact holes 75a, 76a, 75b, and 76b exposing the first source region 405a, the first drain region 406a, the second source region 405b, and the second drain region 406b, and a contact hole 73 exposing a portion of the second gate electrode 26b.

Figure 16A:
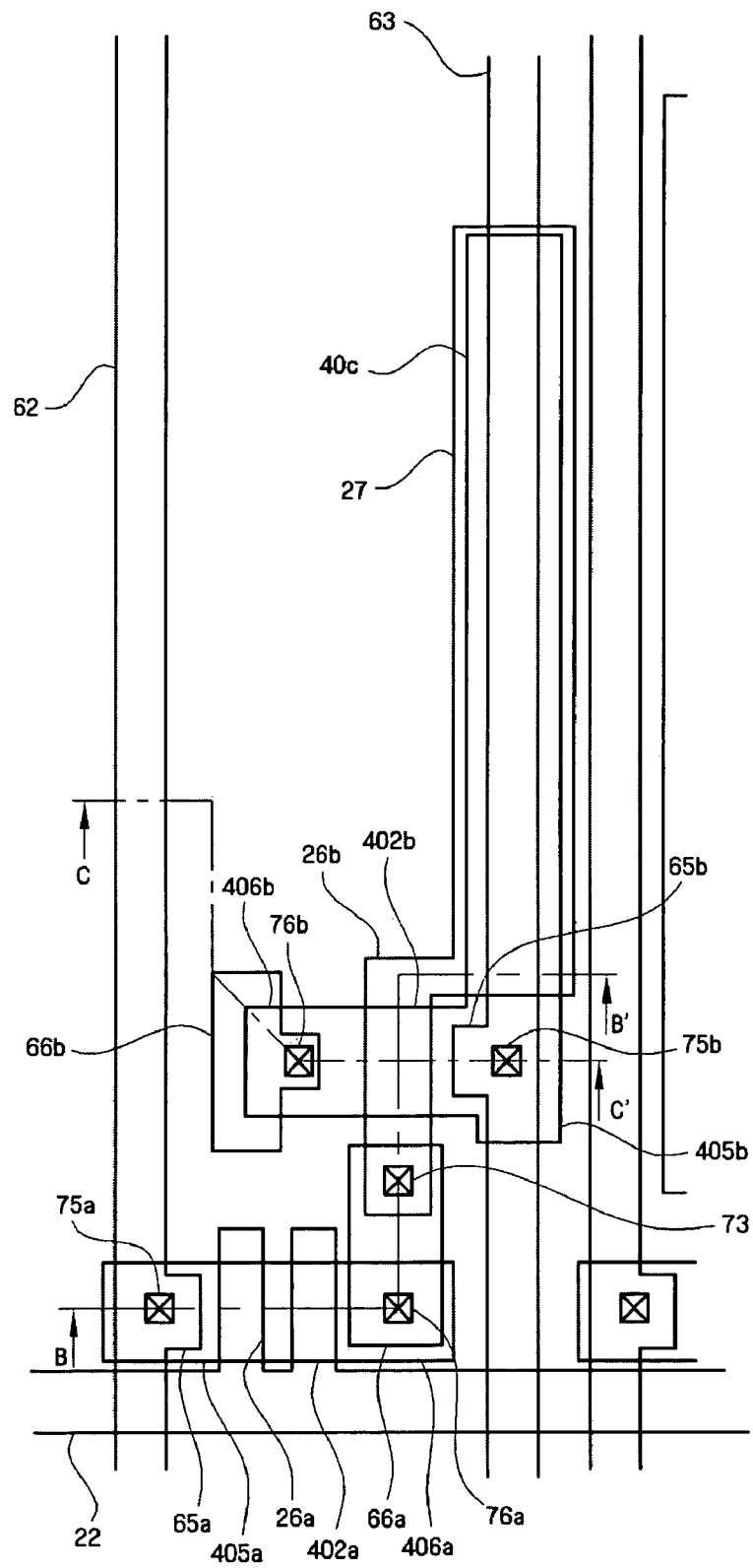
Figure 16B:
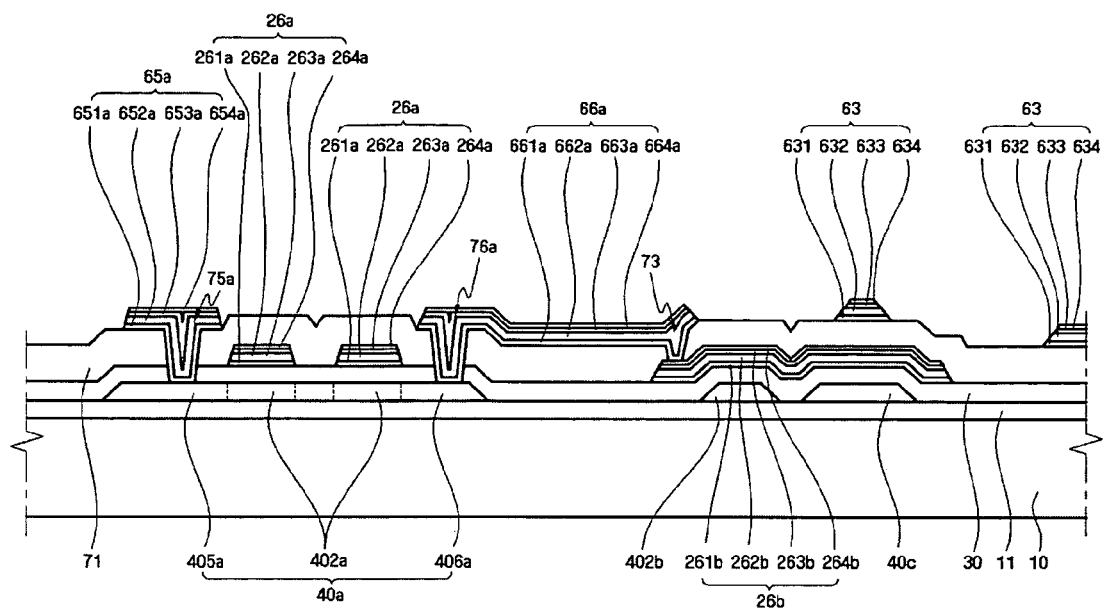
Figure 16C:
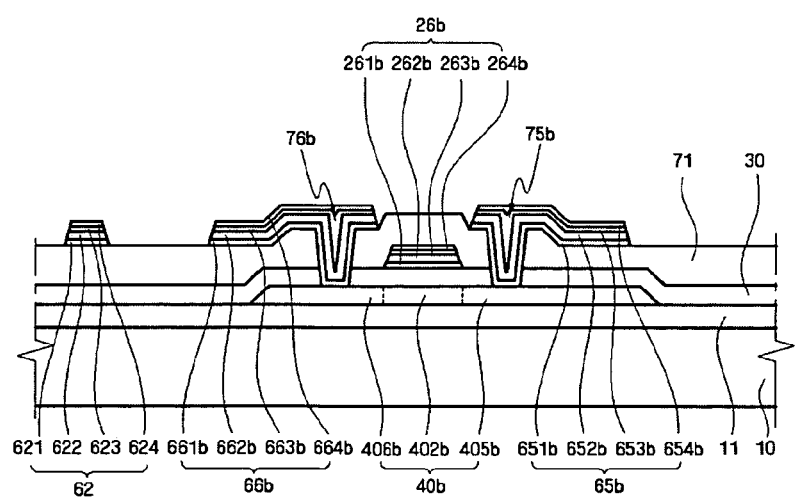

Next, referring to FIGS. 16A through 16C, a multi-layered data layer is formed by sequentially stacking a barrier layer, a copper or its alloy-containing copper conductive layer, a copper nitride-containing intermediate layer, and a capping layer on the first interlayer insulating layer 71 and on portions of the semiconductor layers 40a and 40b exposed through the contact holes 75a, 76a, 75b, and 76b using sputtering. Then, a photoresist pattern defining the data wire (62, 63, 65a, 65b, 66a, and 66b) is formed on the multi-layered data layer. The capping layer, the intermediate layer, and the copper conductive layer are sequentially wet-etched using the photoresist pattern as an etching mask to expose the barrier layer. Then, the barrier layer is dry-etched using the photoresist pattern as an etching mask. This completes formation of a data wire (62, 63, 65a, 65b, 66a, and 66b) including a data line 62 extending in a longitudinal direction, intersecting the gate line 22 to locate a pixel, a driving voltage line 63 supplying a driving voltage, a first source electrode 65a connected to the first source region 405a through a contact hole 75a as a branch of the data line 62, a first drain electrode 66a spaced apart from the first source electrode 65a and connected to the first drain region 406a, a second source electrode 65b connected to the second source region 406a through a contact hole 75b as a branch of the driving voltage line 63, and a second rain electrode 66b spaced apart from the second source electrode 65b and connected to the second drain region 406b. The wire structure according to an exemplary embodiment of the present invention shown in FIG. 1 can also be applied to the data wire (62, 63, 65a, 65b, 66a, and 66b) according to the current embodiment.

According to the thus-completed data wire (62, 63, 65a, 65b, 66a, and 66b), as described above in the embodiment shown in FIG. 1, the intermediate layers 623, 633, 653a, 653b, 663a, and 663b interposed between the copper conductive layers 622, 632, 652a, 652b, 662a, and 662b and the capping layers 624, 634, 654a, 654b, 664a, and 664b deter an electron transfer, thereby deterring galvanic corrosion. Therefore, the data wire (62, 63, 65a, 65b, 66a, and 66b) exhibits a good lateral profile without lateral corrosion and have a good taper angle due to no overhangs. In addition, while the copper conductive layers 622, 632, 652a, 652b, 662a, and 662b are wet-etched, source regions 405a and 405b and drain regions 406a and 406b are covered with the barrier layers 621, 631, 651a, 651b, 661a, and 661b. Therefore, source regions 405a and 405b and drain regions 406a and 406b may be protected from penetration of copper ions dissolved in the etchant. The first and second TFTs manufactured by the method of this embodiment are top gate mode first and second TFTs wherein the gate electrodes 26a and 26b are disposed on the semiconductor layers 40a and 40b.

Figure 17A:
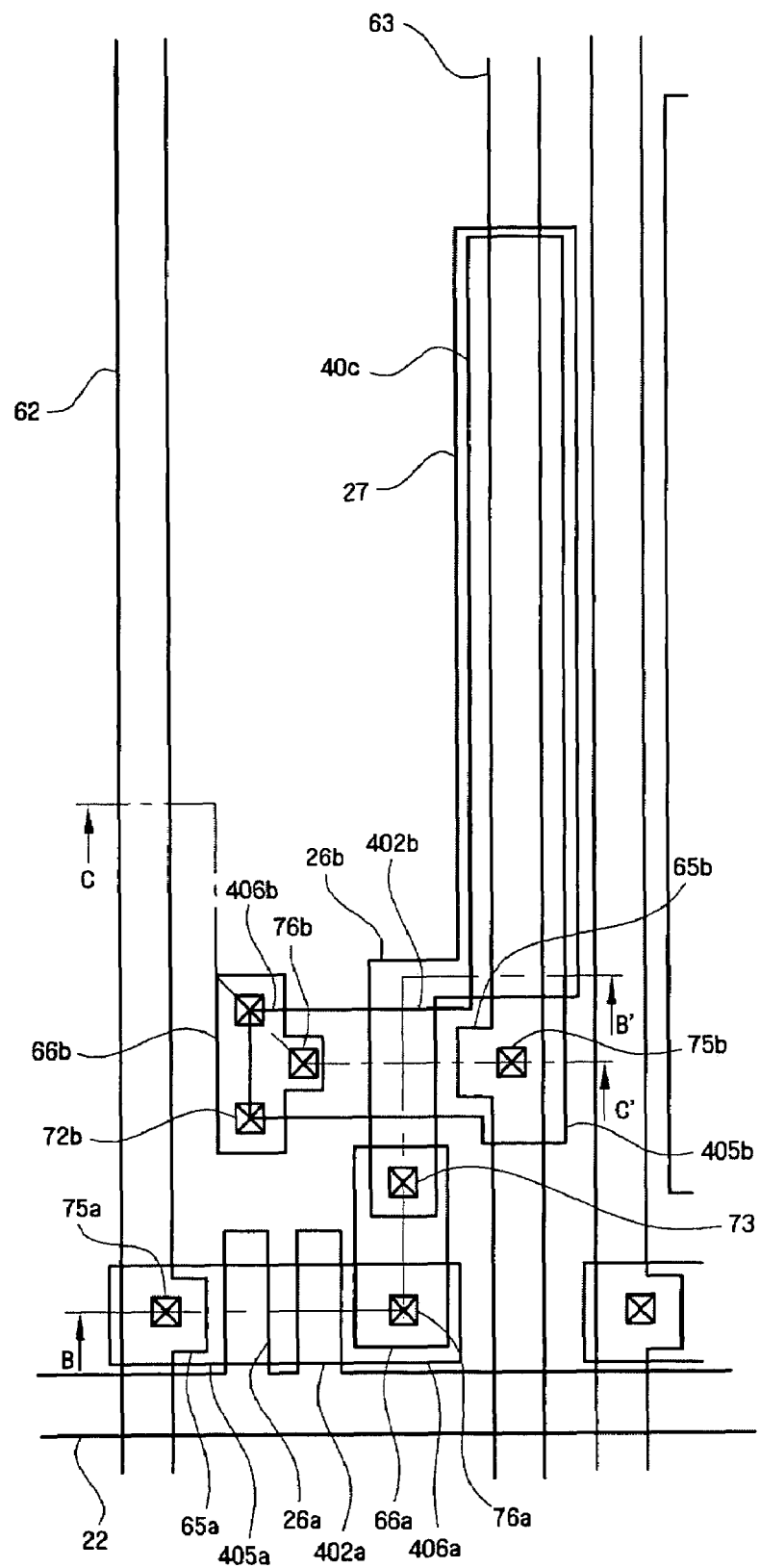
Figure 17B:
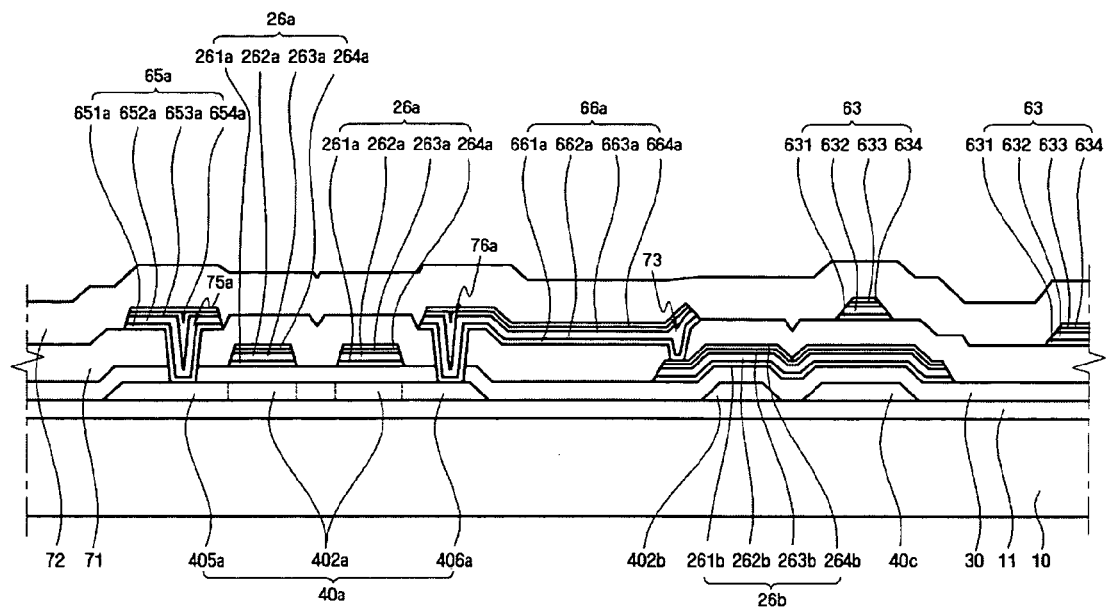
Figure 17C:
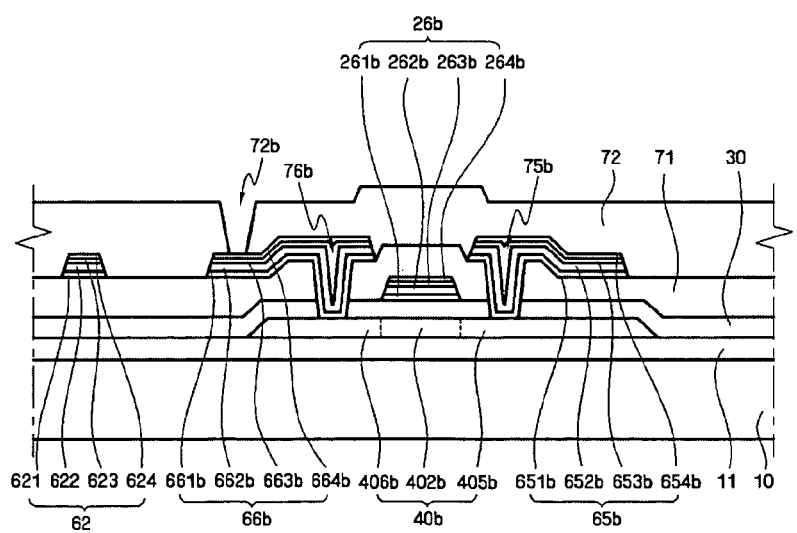

Next, referring to FIGS. 17A through 17C, a second interlayer insulating layer 72 is deposited and patterned to form a contact hole 72b exposing the second drain electrode 66b.

Figure 18A:
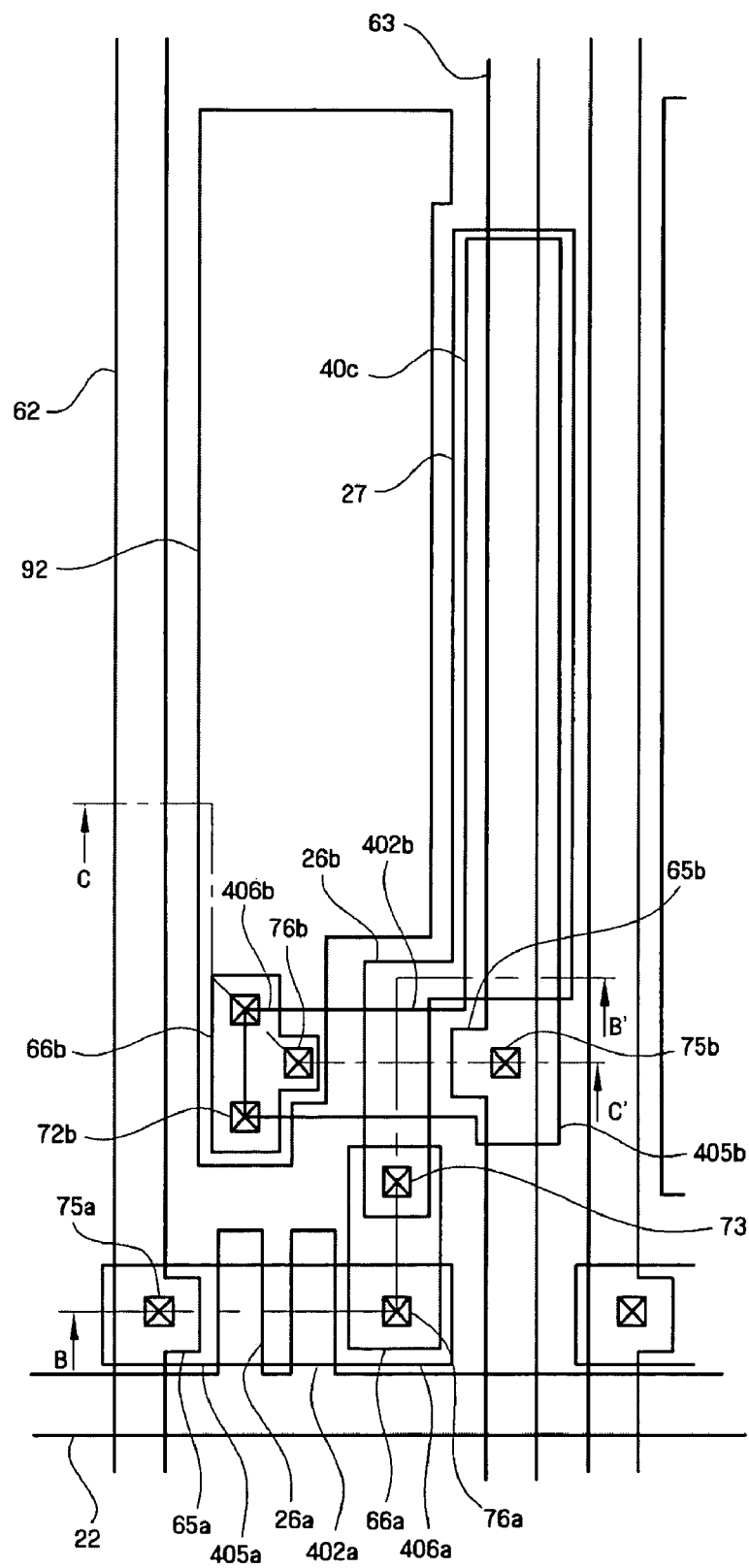
Figure 18B:
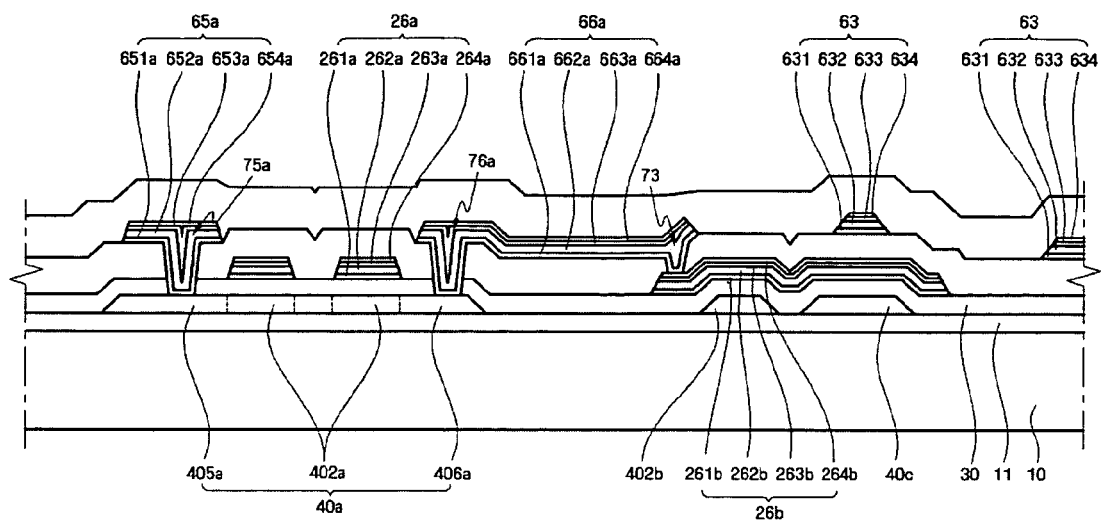
Figure 18C:
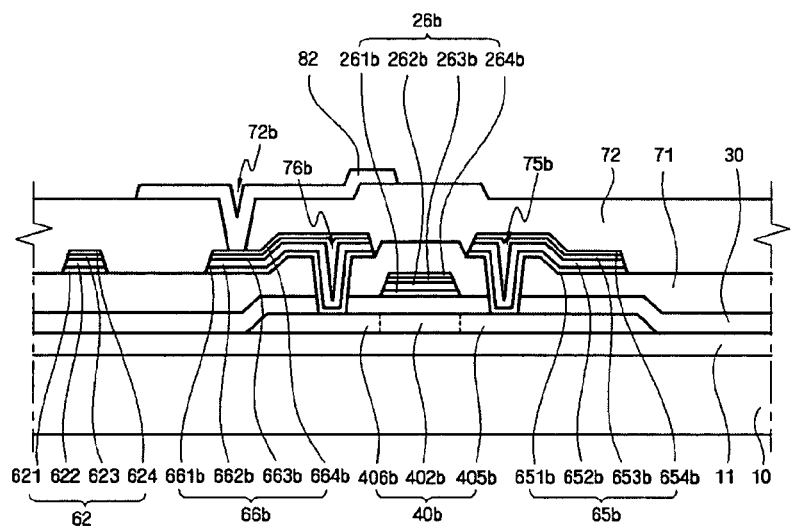

Referring to FIGS. 18A through 18C, a metal with good reflectivity such as aluminum (or its alloy) or silver (or its alloy) is deposited and patterned to form a pixel electrode 82.

Next, referring again to FIGS. 12A through 12C, an organic film including a black pigment is coated on the second interlayer insulating layer 72 having thereon the pixel electrode 82, followed by exposure and development, to form a partition wall 91 covering all areas except an organic light-emitting area. Then, an organic light-emitting layer 92 is formed in the organic light-emitting area using deposition or inkjet printing.

Then, a conductive organic material is coated on the partition wall 91 and the organic light-emitting layer 92 to form a buffer layer 95, and ITO or indium zinc oxide (IZO) is deposited on the buffer layer 95 to form a common electrode 100. Here, the pixel electrode 82 is preferably made of a transparent conductive material such as ITO or IZO. In this case, the common electrode 100 may be made of made of a high reflectivity material such as Al (or Al alloy) or Ag (or Ag alloy).

While TFT substrates and the fabrication methods thereof according to several embodiments of the present invention have been described with regard to four-layered gate wires and/or data wires each comprising a barrier layer, a copper or copper-alloy containing copper conductive layer, a copper nitride intermediate layer, and a capping layer, only one of the gate and data wires may have a four-layered wire structure and the other may have a wire structure well-known in the art or any other particular wire structure within the scope of the present invention.

While the TFT substrate according to an embodiment of the present invention and the fabrication method thereof that have been described above are applied to a bottom gate-type LCD by way of example, the invention is not limited thereto and can also be applied to an organic EL display. In this case, a pair of bottom gate-type TFTs are provided for each pixel as a switching TFT and a driving TFT, respectively. Although the TFT substrate according to another embodiment of the present invention and the fabrication method thereof that have been described above are applied to a top gate-type organic EL display by way of example, the invention is not limited thereto and can also be applied to a TFT substrate for an LCD having a TFT for each pixel. In this case, the top gate-type TFT LCD is preferably of a reflective type. In addition to the illustrated embodiments, the TFT substrate according to the present invention and the fabrication method thereof can be applied to an array on color filter (AOC) substrate having TFTs on a color filter. Further, the TFT substrate according to the present invention and the fabrication method thereof can be applied to a wide variety of TFT substrates, and a detailed explanation thereof is not given so as not to unnecessarily obscure aspects of the present invention.

As described above, according to the present invention, chemical oxidation or corrosion of a copper conductive layer can be deterred while maintaining a good adhesion of the copper conductive layer with a lower structure. In addition, an overhang phenomenon is deterred and the reliability of low-resistance copper wires is ensured, thereby improving signal characteristics and image quality.

Furthermore, in a TFT substrate and a method for fabricating the TFT substrate according to the present invention, superior reliability of a gate wire and/or a data wire can be obtained, thereby improving a signal characteristic, and image quality.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A thin film transistor (TFT) substrate comprising:
   a gate wire disposed on an insulating substrate and comprising a gate line extending in a first direction and a gate electrode connected to the gate line;
   a data wire insulated from the gate wire on the insulating substrate and comprising a data line extending in a second direction to intersect the gate line, a source electrode connected to the data line, and a drain electrode separated from the source electrode;
   a passivation layer disposed on the data wire and having a contact hole exposing the drain electrode; and
   a pixel electrode disposed on the passivation layer and connected to the drain electrode through the contact hole,
   wherein the gate wire or the data wire has a barrier layer disposed on a lower structure, a copper conductive layer comprising copper or copper alloy disposed on the barrier layer, an intermediate layer comprising copper nitride disposed on the copper conductive layer, and a capping layer disposed on the intermediate layer, and
   wherein the barrier layer, the copper conductive layer, the intermediate layer, and the capping layer have substantially the same pattern shape.

2. The TFT substrate of claim 1, wherein the barrier layer comprises Cr, Ti, Ta, V, Zr, W, Nb, Co, Ni, Pd, Pt, or a compound thereof.

3. The TFT substrate of claim 1, wherein the intermediate layer has a thickness in a range of about 50 to about 1,000 angstroms.

4. The TFT substrate of claim 1, wherein the intermediate layer comprises about 0.001 to about 50 atomic percent of nitrogen.

5. The TFT substrate of claim 1, wherein the capping layer comprises Mo, MoN, MoW, MeTi, MoNb, MoZr, IZO, ITO, amorphous ITO, or a compound thereof.

* * * * *